(12) United States Patent
Tsai

(10) Patent No.: US 11,749,225 B2
(45) Date of Patent: Sep. 5, 2023

(54) SCANNING SIGNAL LINE DRIVE CIRCUIT AND DISPLAY DEVICE PROVIDED WITH SAME

(71) Applicant: Sharp Display Technology Corporation, Kameyama (JP)

(72) Inventor: Yi-Cheng Tsai, Kameyama (JP)

(73) Assignee: SHARP DISPLAY TECHNOLOGY CORPORATION, Kameyama (JP)

( * ) Notice: Subject to any disclaimer, the term of this patent is extended or adjusted under 35 U.S.C. 154(b) by 0 days.

(21) Appl. No.: 17/971,672

(22) Filed: Oct. 24, 2022

(65) Prior Publication Data
US 2023/0154430 A1    May 18, 2023

(30) Foreign Application Priority Data
Nov. 12, 2021  (JP) .................... 2021-184742

(51) Int. Cl.
*G09G 3/36*  (2006.01)

(52) U.S. Cl.
CPC ......... *G09G 3/3677* (2013.01); *G09G 3/3688* (2013.01); *G09G 2300/0842* (2013.01); *G09G 2310/0267* (2013.01); *G09G 2310/0286* (2013.01); *G09G 2310/061* (2013.01); *G09G 2330/021* (2013.01)

(58) Field of Classification Search
CPC ............... G09G 3/3677; G09G 3/3688; G09G 2300/0842; G09G 2310/0267; G09G 2310/0286; G09G 2310/061; G09G 2330/021
See application file for complete search history.

(56) References Cited

U.S. PATENT DOCUMENTS

2012/0087459 A1*  4/2012  Nakamizo ............ G11C 19/184
                                                    377/64
2018/0196563 A1*  7/2018  Iwase .................... G06F 3/0412
(Continued)

FOREIGN PATENT DOCUMENTS

WO    2010/146743 A1    12/2010
WO    2017/006815 A1    1/2017
(Continued)

*Primary Examiner* — Amare Mengistu
*Assistant Examiner* — Jennifer L Zubajlo
(74) *Attorney, Agent, or Firm* — KEATING & BENNETT, LLP

(57) ABSTRACT

A unit circuit constituting each stage of a shift register serving as a gate driver of a display device charges an internal node to an H level via a transistor T2 when an output signal G(n−4) of a preceding stage turns to the H level and sets the internal node to an L level via a transistor T3 when an output signal G(n+8) of a succeeding stage turns to the H level. Each of the unit circuits of last eight stages in the gate driver is provided with a transistor T4 including a gate terminal to which the signal G(n−4) is applied and a drain terminal connected to the internal node. A signal is applied to a source terminal of the transistor T4, the signal being at the H level during a period when the internal node of any of the last eight stages is to be set to the H level, and being the L level during the other periods. This suppresses a voltage fluctuation generated in the internal node when a stabilization circuit does not normally function.

16 Claims, 22 Drawing Sheets

(56) References Cited

U.S. PATENT DOCUMENTS

| | | | |
|---|---|---|---|
| 2019/0114984 A1* | 4/2019 | Tanaka | G09G 3/3674 |
| 2020/0035168 A1* | 1/2020 | Ueno | G09G 3/3291 |
| 2020/0135110 A1* | 4/2020 | Yokoyama | G09G 3/3266 |
| 2020/0394976 A1* | 12/2020 | Takeuchi | G11C 19/28 |
| 2020/0394977 A1* | 12/2020 | Iwase | G09G 3/3677 |
| 2021/0327387 A1* | 10/2021 | Iwase | G09G 3/3688 |
| 2021/0327388 A1* | 10/2021 | Iwase | G09G 3/3674 |
| 2021/0375226 A1* | 12/2021 | Fujihara | G11C 19/28 |

FOREIGN PATENT DOCUMENTS

| | | |
|---|---|---|
| WO | 2019/017264 A1 | 1/2019 |
| WO | WO-2019017264 A1 * | 1/2019 |

* cited by examiner

SCANNING SIGNAL LINE DRIVE CIRCUIT AND DISPLAY DEVICE PROVIDED WITH SAME

CROSS-REFERENCE TO RELATED APPLICATIONS

This application claims the benefit of priority to Japanese Patent Application Number 2021-184742 filed on Nov. 12, 2021. The entire contents of the above-identified application are hereby incorporated by reference.

BACKGROUND

Technical Field

The following disclosure relates to a display device and more particularly relates to a scanning signal line drive circuit for driving scanning signal lines disposed on a display portion of the display device.

Typically, a matrix display device has been known in which the matrix display device is provided with a display portion including a plurality of data signal lines (also referred to as "data lines"), a plurality of scanning signal lines (also referred to as "gate lines") intersecting the plurality of data signal lines, and a plurality of pixel forming sections arranged in a matrix shape along the plurality of data signal lines and the plurality of scanning signal lines. Such a matrix display device includes a data signal line drive circuit (also referred to as a "data driver" or a "source driver") for driving the plurality of data signal lines and a scanning signal line drive circuit (also referred to as a "gate driver") for driving the plurality of scanning signal lines. The scanning signal line drive circuit applies each of a plurality of scanning signals to a corresponding one of the plurality of scanning signal lines so that each of the plurality of scanning signal lines is sequentially selected in each frame period, and the data signal line drive circuit applies each of a plurality of data signals representing an image signal to be displayed to a corresponding one of the plurality of data signal lines in association with such a sequential selection of the plurality of scanning signal lines. Accordingly, each of a plurality of pixel data constituting an image data representing an image to be displayed is provided in a corresponding one of the plurality of pixel forming sections.

Incidentally, in an active-matrix display device, typically, the scanning signal line drive circuit has been mounted as an integrated circuit (IC) chip on a peripheral portion of a substrate constituting a display panel including the display portion described above in many cases. However, in recent years, more and more display devices have a configuration in which the scanning signal line drive circuit is formed directly on a substrate. Such a scanning signal line drive circuit is referred to as a "monolithic gate driver" or the like, and a display panel including such a scanning signal line drive circuit is referred to as a "gate driver monolithic panel" or a "GDM panel".

In the GDM panel, the scanning signal is input from the gate driver formed in a frame region of the GDM toward a display portion serving as a display region. According to such a GDM panel, by using a thin film transistor (hereinafter abbreviated as "TFT") including a channel layer formed of an oxide semiconductor such as low-temperature polysilicon particularly having high mobility characteristics or Indium Gallium Zinc Oxide (IGZO). the gate driver can be formed on glass in a small area and frame narrowing can be realized. In the GDM panel, a TFT including a channel layer formed of amorphous silicon, which is easier to manufacture than the TFT including the channel layer formed of the oxide semiconductor such as the low-temperature polysilicon or IGZO, is also widely used.

The gate driver serving as the scanning signal line drive circuit in the active-matrix display device includes a shift register having the number of stages corresponding to the number of the scanning signal lines in the display portion. In a case where the GDM panel is used as the display panel, a bistable circuit (hereinafter referred to as a "unit circuit") constituting each stage of the shift register has a configuration illustrated in FIG. 4, for example. Each unit circuit includes an internal node NA for holding a voltage indicating a state as the bistable circuit, and also includes a TFT serving as an output transistor T1 directly connected to the scanning signal line (gate line) corresponding to the unit circuit, and a gate terminal of the output transistor T1 is connected to the internal node NA. Supply of a scanning signal G(n) to the scanning signal line is controlled by the output transistor T1. However, when a voltage of the internal node NA in other words a voltage of the gate terminal of the output transistor T1 fluctuates due to influence of a noise due to a parasitic capacitance and the like between the internal node NA including the gate terminal of the output transistor T1 and other wiring lines, a leakage current occurs in the output transistor T1, and a malfunction occurs. In order to normally drive each scanning signal line, the output transistor T1 in the unit circuit corresponding to each scanning signal line needs to maintain an off state regardless of temperature and noise in a predetermined period (hereinafter referred to as a "output off period") set as a period to be in the off state.

Thus, as in the unit circuit illustrated in FIG. 4, a unit circuit has been known in which a stabilization circuit 18 for preventing the voltage fluctuation of the internal node NA is provided so that the output transistor T1 is surely maintained in the off state during the output off period of the unit circuit. For example, WO 2017/006815 Pamphlet describes a circuit as illustrated in FIG. 22 as the unit circuit used in the shift register constituting the gate driver (see FIG. 7 in the same document). This unit circuit is provided with a circuit (first output control node stabilizing unit) 312a for maintaining a node N1a (node corresponding to the internal node NA described above) at a low level throughout a period (non-select period) other than the period when the gate line serving as the scanning signal line is in a select state, and this first output control node stabilizing unit 312a corresponds to the stabilization circuit.

SUMMARY

As illustrated in FIG. 4, in the GDM panel, each unit circuit in the shift register constituting the gate driver includes a TFT including a gate terminal to which a clock signal is supplied and a TFT serving as the output transistor T1 for outputting a scanning signal to be supplied to the scanning signal line. For example, in a case of a shift register operating with a six-phase clock with on-duty set to 2/6, the stabilization circuit includes a TFT in which a high level voltage (VDD) is applied to the gate terminal during at least 2/6 of the operation period. In an N-channel type TFT in which the channel layer is formed of the oxide semiconductor such as the amorphous silicon or IGZO, a phenomenon (referred to as a "threshold shift") is known in which a threshold voltage of the TFT is shifted in an increasing direction when a high voltage is applied to the gate terminal of the N-channel type TFT for a long time. Such a deterioration phenomenon of the TFT is noticeable particularly under a high temperature condition, and when the same voltage is applied to the gate terminal of the TFT, the larger the threshold shift, the smaller a current between the source terminal and the drain terminal. Thus, the TFT included in the stabilization circuit 18 may deteriorate faster than TFTs (transistors T1, T2, and T3) constituting the shift register. When the TFT of the stabilization circuit 18 deteriorates, the internal node NA cannot be sufficiently maintained at a low level (level for setting the output transistor T1 to the off state) voltage (VSS), and thus the TFT of the stabilization circuit 18 is susceptible to noise.

In each unit circuit in the shift register, it is conceivable to take measures other than the stabilization circuit in order to prevent the voltage fluctuation of the internal node NA so that the malfunction does not occur. However, such measures lead to an increase in the circuit area of the shift register, and the frame region in the GDM panel increases. On the other hand, in recent years, there has been an increasing demand for the frame narrowing also in a display for a notebook computer, a television, or the like, in addition to a display for a mobile device such as a smartphone.

Thus, it is desirable to provide a scanning signal line drive circuit having high reliability in which malfunction does not occur while suppressing the increase in the frame region of the display panel, and a display device provided with the above-described scanning signal line drive circuit.

(1) The scanning signal line drive circuit according to some embodiments of the disclosure is a scanning signal line drive circuit configured to drive a plurality of scanning signal lines arranged on a display portion of a display device, and includes a plurality of unit circuits cascade-connected to each other and configured to operate as a shift register based on a multiphase clock signal, wherein the multiphase clock signal includes a plurality of clock signals cyclically corresponding to the plurality of unit circuits, each of the plurality of unit circuits is a bistable circuit corresponding to one of the plurality of scanning signal lines, receives a corresponding clock signal among the plurality of clock signals as an input clock signal, receives an output signal of a predetermined unit circuit of preceding stages or a first input signal applied from the outside of the shift register as a set signal, receives an output signal of a predetermined unit circuit of a succeeding stage or a second input signal applied from the outside of the shift register as a reset signal, and includes a first internal node configured to selectively hold voltages of a first and second logic levels, a set circuit configured to apply the voltage of the first logic level to the first internal node in response to the set signal, a reset circuit configured to apply the voltage of the second logic level to the first internal node in response to the reset signal, and an output circuit configured to generate an output signal of a logic level corresponding to the input clock signal and apply the output signal to a corresponding scanning signal line when the voltage held in the first internal node is at the first logic level, the predetermined unit circuit of the succeeding stage configured to output the signal input as the reset signal is a unit circuit of k stages after the own stage, k being a natural number satisfying $i-j \leq k \leq i-1$ when the predetermined unit circuit of the preceding stages configured to output the signal input as the set signal is a unit circuit of j stages before the own stage and the number of phases of the multiphase clock signal is i, the reset circuit includes a reset transistor including a first conduction terminal connected to the first internal node, a second conduction terminal configured to receive the voltage of the second logic level, and a control terminal configured to receive the reset signal, the reset signal input to each of the plurality of unit circuits is an output signal of the unit circuit of k stages after the own stage when the own stage is not one of unit circuits of last k stages in the plurality of unit circuits and is the second input signal when the own stage is any of the unit circuits of the last k stages, the second input signal input to each of the unit circuits of the last k stages is a signal configured to turn to an active state only for a predetermined period after an output signal of the own stage changes from the active state to a non-active state, each of the unit circuits of the last k stages includes a compensation circuit including a compensation transistor including a first conduction terminal connected to the first internal node, the compensation transistor turning on or off according to a compensation control signal being one of the set signal of the own stage or the output signal of the own stage, and the compensation circuit in each of the unit circuits of the last k stages is configured to turn the compensation transistor to an off state or apply the voltage of the first logic level to the first internal node during a period when the first internal node is to hold the voltage of the first logic level, and turn the compensation transistor to an on state or the off state according to the voltage of the compensation control signal and apply the voltage of the second logic level to the first internal node via the compensation transistor when the compensation transistor is in the on state during a period when the first internal node is to hold the voltage of the second logic level.

(2) The scanning signal line drive circuit according to some embodiments of the disclosure includes the configuration of (1), wherein the compensation transistor in each of the unit circuits of the last k stages further includes a second conduction terminal configured to receive a first compensation stop signal and a control terminal configured to receive the set signal of the own stage, and the first compensation stop signal is the voltage of the first logic level during a period when any of the output signals of the preceding stages applied to any of the unit circuits of the last k stages as the set signal is in the active state, and is the voltage of the second logic level during a period other than the period.

(3) The scanning signal line drive circuit according to some embodiments of the disclosure includes the configuration of (1), wherein the compensation transistor in each of the unit circuits of the last k stages further includes a second conduction terminal configured to receive a second compensation stop signal and a control terminal configured to receive an output signal of the own stage, and the second compensation stop signal is the voltage of the first logic level during a period when any of the output signals of the last k stages is in the active state, and is the voltage of the second logic level during a period other than the period.

(4) The scanning signal line drive circuit according to some embodiments of the disclosure includes the configuration of (1), wherein the compensation transistor in each of the unit circuits of the last k stages further includes a second conduction terminal configured to receive the voltage of the second logic level and a control terminal, the compensation circuit in each of the unit circuits of the last k stages further includes a compensation internal node configured to selectively hold the voltages of the first and second logic levels, a compensation setting transistor including a first conduction terminal connected to the compensation internal node, a second conduction terminal configured to receive the voltage of the second logic level, and a control terminal configured to receive the set signal of the own stage, a compensation control transistor including a first conduction terminal connected to the compensation internal node, a second conduction terminal connected to the control terminal of the compensation transistor, and a control terminal configured to receive the set signal of the own stage, and a compensation control capacitor including a first terminal and a second terminal connected to the control terminal and the second conduction terminal of the compensation control transistor, respectively, and the compensation circuit is configured such that when the voltage of the set signal of the own stage is at the first logic level, the compensation setting transistor turns to the on state and applies the voltage of the second logic level to the compensation internal node, and the compensation control transistor turns to the on state and applies the voltage of the compensation internal node to the control terminal of the compensation transistor, and when the voltage of the set signal of the own stage is at the second logic level, the compensation setting transistor and the compensation control transistor turn to the off state.

(5) The scanning signal line drive circuit according to some embodiments of the disclosure includes the configuration of (4), wherein the compensation circuit in each of the unit circuits of the last k stages further includes a transistor including a first conduction terminal connected to the control terminal of the compensation transistor, a second conduction terminal for receiving the voltage of the second logic level, and a control terminal configured to receive the second input signal applied to the own stage.

(6) The scanning signal line drive circuit according to some embodiments of the disclosure includes the configuration of (4) or (5), wherein the compensation circuit in each of the unit circuits of the last k stages further includes a compensation auxiliary circuit configured to apply the voltage of the first logic level to the compensation internal node when the voltage of the corresponding clock signal is at the first logic level.

(7) The scanning signal line drive circuit according to some embodiments of the disclosure includes the configuration of the (1), wherein the compensation transistor in each of the unit circuits of the last k stages further includes a second conduction terminal configured to receive a voltage of the second logic level and a control terminal, the compensation circuit in each of the unit circuits of the last k stages further includes a compensation internal node configured to selectively hold the voltages of the first and second logic levels, a compensation setting transistor including a first conduction terminal connected to the compensation internal node, a second conduction terminal configured to receive the voltage of the second logic level, and a control terminal configured to receive an output signal of the own stage, a compensation control transistor including a first conduction terminal connected to the compensation internal node, a second conduction terminal connected to the control terminal of the compensation transistor, and a control terminal configured to receive an output signal of the own stage, and a compensation control capacitor including a first terminal and a second terminal connected to the control terminal and the second conduction terminal of the compensation control transistor, respectively, and the compensation circuit is configured such that when the voltage of the output signal of the own stage is at the first logic level, the compensation setting transistor turns to the on state and applies the voltage of the second logic level to the compensation internal node, and the compensation control transistor turns to the on state and applies the voltage of the compensation internal node to the control terminal of the compensation transistor, and when the voltage of the output signal of the own stage is at the second logic level, the compensation setting transistor and the compensation control transistor turn to the off state.

(8) The scanning signal line drive circuit according to some embodiments of the disclosure includes the configuration of (7), wherein the compensation circuit in each of the unit circuits of the last k stages further includes a transistor including a first conduction terminal connected to a control terminal of the compensation transistor, a second conduction terminal configured to receive the voltage of the second logic level, and a control terminal configured to receive the second input signal applied to the own stage.

(9) The scanning signal line drive circuit according to some embodiments of the disclosure includes the configuration of (7) or (8), wherein the compensation circuit in each of the unit circuits of the last k stages further includes a compensation auxiliary circuit configured to receive any of the plurality of clock signals in which a pulse does not overlap the corresponding clock signal among the plurality of clock signals, and apply the voltage of the first logic level to the compensation internal node when the voltage of the received clock signal is at the first logic level.

(10) The scanning signal line drive circuit according to some embodiments of the disclosure includes the configuration of (2), wherein the natural number k configured to specify the last k stages is i–j.

(11) The scanning signal line drive circuit according to some embodiments of the disclosure includes the configuration of (10), wherein each unit circuit other than last i stages among the plurality of unit circuits further includes a compensation transistor including a first conduction terminal connected to the first internal node, a second conduction terminal configured to receive the voltage of the second logic level, and a control terminal configured to receive an output signal of a unit circuit of i stages after the own stage, and each unit circuit other than the last i stages among the plurality of unit circuits is configured such that the compensation transistor is in the on state when the voltage of the output signal of the unit circuit of the i stages after is at the first logic level, and the compensation transistor is in the off state when the voltage of the output signal of the unit circuit of the i stages after is at the second logic level.

(12) The scanning signal line drive circuit according to some embodiments of the disclosure includes the configuration of (11), wherein each unit circuit of the last i stages further includes a compensation transistor including a first conduction terminal connected to the first internal node, a second conduction terminal configured to receive a second compensation stop signal, and a control terminal configured to receive the output signal of the own stage, each unit circuit of the last i stages is configured such that the compensation transistor is in the on state when the voltage of the output signal of the own stage is at the first logic level, and the compensation transistor is in the off state when the voltage of the output signal of the own stage is at the second logic level, and the second compensation stop signal is the voltage of the first logic level during a period when any of output signals of the last i stages is in the active state, and is the voltage of the second logic level during a period other than the period.

(13) The scanning signal line drive circuit according to some embodiments of the disclosure includes the configuration of any one of (1) to (12), wherein the output circuit includes an output transistor including a first conduction terminal configured to receive the input clock signal, a second conduction terminal connected to a corresponding scanning signal line, and a control terminal connected to the first internal node, and a capacitor including a first terminal and a second terminal connected to the control terminal and the second conduction terminal of the output transistor, respectively.

(14) A display device according to some embodiments of the disclosure is a display device including a display portion provided with a plurality of data signal lines, a plurality of scanning signal lines intersecting the plurality of data signal lines, and a plurality of pixel forming sections arranged in a matrix shape along the plurality of data signal lines and the plurality of scanning signal lines, wherein the display device includes a data signal line drive circuit configured to drive the plurality of data signal lines, and the scanning signal line drive circuit including the configuration of any one of (1) to (13).

(15) The display device according to some embodiments of the disclosure includes the configuration of (14), wherein the scanning signal line drive circuit includes a first scanning signal line drive unit disposed on one end side of the plurality of scanning signal lines and including unit circuits each corresponding to a respective one of odd-numbered scanning signal lines among the plurality of scanning signal lines as the plurality of unit circuits, and a second scanning signal line drive unit disposed on the other end side of the plurality of scanning signal lines and including unit circuits each corresponding to a respective one of even-numbered scanning signal lines among the plurality of scanning signal lines as the plurality of unit circuits.

(16) The display device according to some embodiments of the disclosure includes the configuration of (14) or (15), wherein the scanning signal line drive circuit and the display portion are integrally formed on an identical substrate.

In some of the above embodiments of the disclosure, in the scanning signal line drive circuit, the shift register is configured which operates based on the multiphase clock signal by the plurality of unit circuits cascade-connected to each other, and in the unit circuit other than the last k stages among the plurality of unit circuits, the output signal of the unit circuit of k stages after the own stage is input as the reset signal and applied to the control terminal of the reset transistor. Here, k is a natural number satisfying i−j≤k≤i−1, where the predetermined unit circuit of the preceding stages for outputting the signal input as the set signal is a unit circuit of j stages before the own stage and the number of phases of the multiphase clock signal is i. Accordingly, in the unit circuit other than the last k stages, even in a case where the stabilization circuit provided therein does not normally function (or even in a case where the stabilization circuit is not provided), when a voltage fluctuation occurs in the first internal node due to the output signal serving as the set signal of the unit circuit of j stages before during a period when the first internal node is to be maintained at the second logic level (non-active state), a current flows through the reset transistor to suppress the voltage fluctuation.

On the other hand, in the unit circuit included in the last k stages, the second input signal is applied as the reset signal to the control terminal of the reset transistor. This second input signal is a signal that turns to the active state only for a predetermined period after the output signal of the own stage changes from the active state to the non-active state, and the voltage fluctuation of the first internal node as described above cannot be suppressed by the reset transistor. However, the unit circuit included in the last k stages is provided with a compensation circuit including the compensation transistor including the first conduction terminal connected to the first internal node, the compensation transistor turning on or off in response to the compensation control signal serving as one of the set signal to the own stage or the output signal of the own stage. Accordingly, in the unit circuit of the last k stages, even in a case where the stabilization circuit provided therein does not normally function (or even in a case where the stabilization circuit is not provided), when the voltage fluctuation occurs in the first internal node due to the output signal serving as the set signal of the unit circuit of j stages before or the input clock signal to the own stage during a period when the first internal node is to be maintained at the second logic level (non-active state), a current flows through the compensation transistor to suppress the voltage fluctuation.

As described above, according to some of the above-described embodiments of the disclosure, in any of the plurality of unit circuits, when the voltage fluctuation occurs in the first internal node during a period when the first internal node is to be maintained at the second logic level (non-active state) because the stabilization circuit provided therein does not normally function (or because the stabilization circuit is not provided), the current flows through the reset transistor or the compensation transistor to suppress the voltage fluctuation. This prevents malfunction due to fluctuation in the voltage of the scanning signal line during a period other than a period when the active signal is to be applied for selecting each scanning signal line. In some of the above-described embodiments of the disclosure, the signal input for suppressing the voltage fluctuation of the first internal node in each unit circuit is the output signal of another stage arranged at a position relatively close to the own stage, and thus an increase in the frame region can be suppressed to a small extent in the display device using the scanning signal line drive circuit.

Note that the compensation circuit provided in each unit circuit of the last k stages is to be configured so as not to substantially affect the voltage of the first internal node during a period when the first internal node is to be maintained at the first logic level (active state), and thus, this can be achieved by, for example, the following. That is, in a case where the output signal serving as the set signal of the unit circuit of j stages before is applied to the control terminal of the compensation transistor, a voltage signal (the first compensation stop signal in the configuration of (2)) may be applied to the second conduction terminal of the compensation transistor, the voltage signal being at the first logic level during a period when any of the output signals serving as the set signal of the preceding stage applied to any of the unit circuits of the last k stages is in the active state and being at the second logic level during a period other than the period. In a case where the output signal of the own stage is applied to the control terminal of the compensation transistor, a voltage signal (the second compensation stop signal in the configuration of (3)) may be applied to the second conduction terminal of the compensation transistor, the voltage signal being at the first logic level during a period when any of the output signals of the last k stages is in the active state and being at the second logic level during a period other than the period.

BRIEF DESCRIPTION OF DRAWINGS

The disclosure will be described with reference to the accompanying drawings, wherein like numbers reference like elements.

DESCRIPTION OF EMBODIMENTS

In the following, embodiments will be described with reference to the accompanying drawings. Note that in each of the transistors referred to below, the gate terminal corresponds to a control terminal, one of a drain terminal and a source terminal corresponds to a first conduction terminal, and the other corresponds to a second conduction terminal. All the transistors in the present embodiments are N-channel type transistors, but the disclosure is not limited thereto. Note that in the N-channel type transistor, among the two conduction terminals, one having higher potential is a drain terminal and one having lower potential is a source terminal, but in the present description, even in a case where high and low of potentials of the two conduction terminals are inverted during operations, one of the two conduction terminals is fixedly referred to as the "drain terminal" and the other is fixedly referred to as the "source terminal". Furthermore, "connection" in the present description means "electrical connection" unless otherwise specified, and in the scope without departing from the subject matters of the disclosure, it includes not only a case to mean direct connection, but also a case to mean indirect connection through other elements.

1. First Embodiment 1.1 Overall Configuration and Operation Outline

Figure 1:
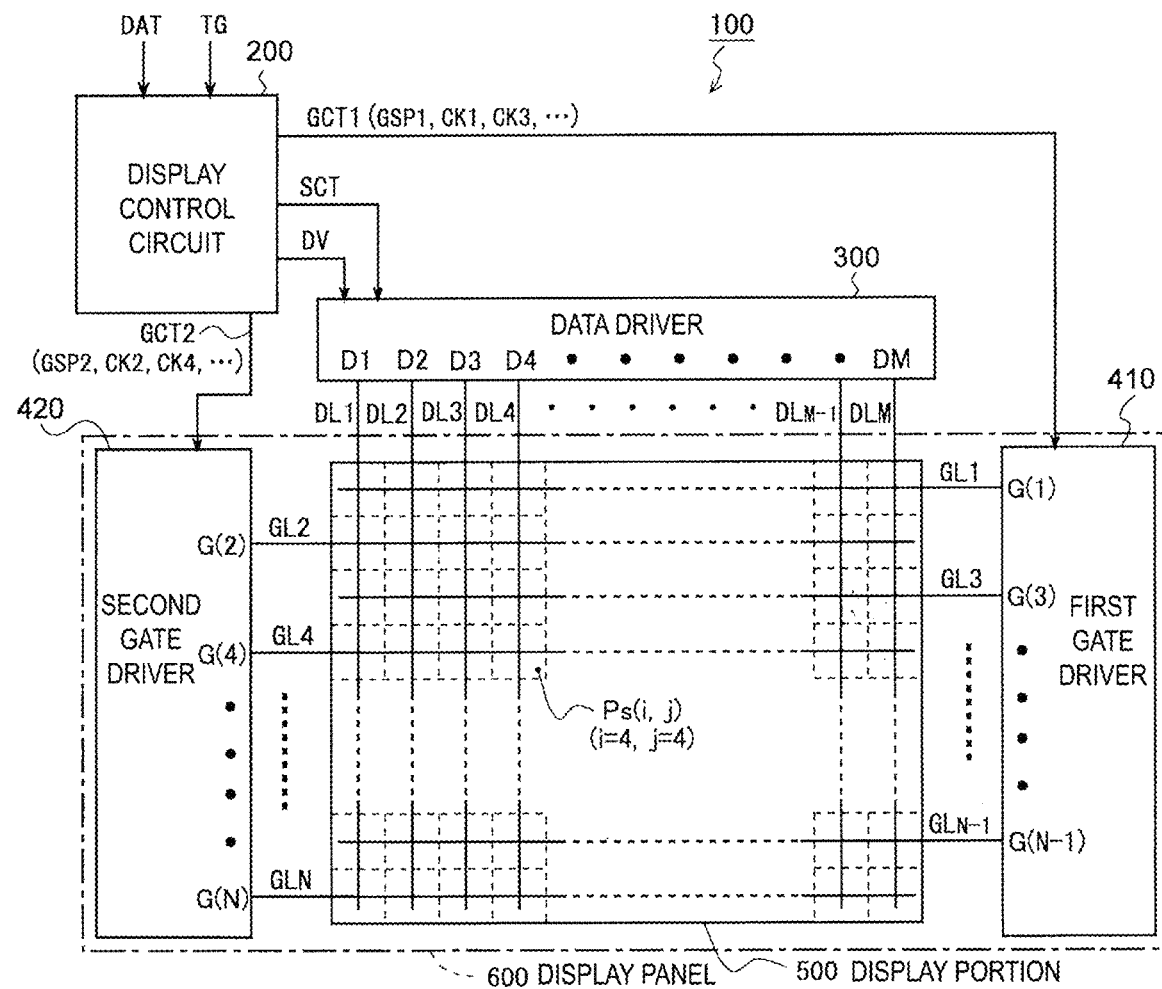
FIG. 1 is a block diagram illustrating an overall configuration of an active-matrix display device according to a first embodiment.

FIG. 1 is a block diagram illustrating an overall configuration of an active-matrix liquid crystal display device 100 according to the first embodiment. The display device 100 includes a display control circuit 200, a data driver 300 serving as a data signal line drive circuit, and a display panel 600 including a display portion 500 and a gate driver serving as a scanning signal line drive circuit. In the present embodiment, a pixel circuit constituting the display portion 500 and the gate driver are integrally formed in one substrate (referred to as a "TFT substrate") among two substrates constituting the display panel 600. The gate driver includes a first gate driver 410 and a second gate driver 420 disposed so as to face each other across the display portion 500 as illustrated in FIG. 1.

The display portion 500 is provided with a plurality (M) of data lines DL1 to DLM, a plurality (N) of gate lines GL1 to GLN serving as scanning signal lines intersecting the plurality of data lines DL1 to DLM, and a plurality (M×N) of pixel forming sections Ps(i, j) (i=1 to N, j=1 to M)

arranged in a matrix shape along the plurality of data lines DL1 to DLM and the plurality of gate lines GL1 to GLN. Each of the pixel forming sections Ps(i, j) corresponds to one of the plurality of data lines DL1 to DLM, and corresponds to one of the plurality of gate lines GL1 to GLN.

Figure 2:
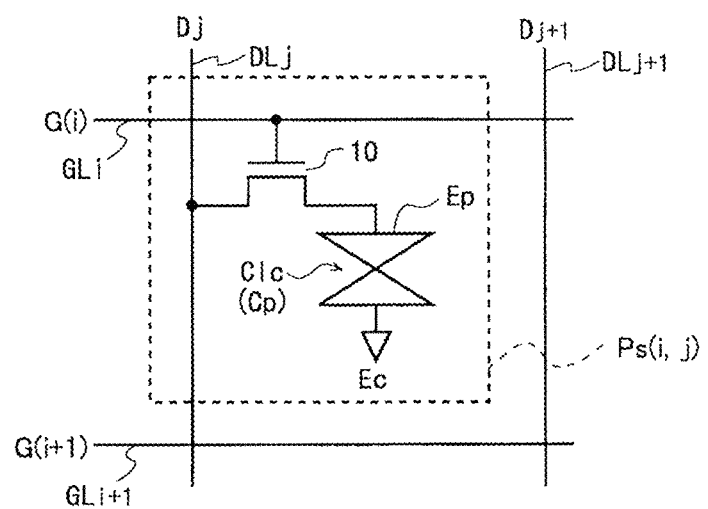
FIG. 2 is a circuit diagram illustrating an electrical configuration of a pixel forming section in the first embodiment.

FIG. 2 is a circuit diagram illustrating an electrical configuration of one pixel forming section Ps(i, j) in the display portion 500. As illustrated in FIG. 2, each pixel forming section Ps(i, j) includes an N-channel type thin film transistor (TFT) 10 serving as a pixel switching element and including a gate terminal connected to a corresponding gate line GLi and a source terminal connected to a corresponding data line DLj, a pixel electrode Ep connected to a drain terminal of the transistor 10, a common electrode Ec serving as a counter electrode provided in common to the plurality of pixel forming sections Ps(i, j) (i=1 to N, j=1 to M), and a liquid crystal layer provided in common to the plurality of pixel forming sections Ps(i, j) (i=1 to N, j=1 to M) and sandwiched between the pixel electrode Ep and the common electrode Ec. A pixel capacitance Cp is configured by a liquid crystal capacitance Clc formed by the pixel electrode Ep and the common electrode Ec.

As the thin film transistor 10 in the pixel forming section Ps(i, j), a thin film transistor using amorphous silicon for the channel layer (a-Si TFT), a thin film transistor using an oxide semiconductor such as IGZO for the channel layer (oxide TFT), a thin film transistor using low-temperature polysilicon for the channel layer (LTPS-TFT), and the like can be employed. Note that, the display panel 600 in the present embodiment is a GDM panel in which the pixel circuit composed of elements formed on the TFT substrate among the pixel forming section Ps constituting the display portion 500 and the gate driver are integrally formed. A transistor in the pixel forming section Ps and a transistor included in the gate driver are thin film transistors whose channel layers are formed of the same type of semiconductor.

The display control circuit 200 receives an image signal DAT and a timing control signal TG applied from the outside, and outputs a digital video signal DV, a data side control signal SCT for controlling the operation of the data driver 300, a first scanning side control signal GCT1 for controlling a first gate driver 410, and a second scanning side control signal GCT2 for controlling a second gate driver 420. The data side control signal SCT includes a data start pulse signal, a data clock signal, a latch strobe signal, and the like. The first scanning side control signal GCT1 includes a first gate start pulse signal GSP1, a first, a third, . . . , and an eleventh gate clock signals CK1, CK3, . . . , CK11, and the like. The second scanning side control signal GCT2 includes a second gate start pulse signal GSP2, a second, a fourth, . . . , and a twelfth gate clock signals CK2, CK4, . . . , CK12, and the like. Each of the first and second scanning side control signals GCT1 and GCT2 includes compensation stop signals V1 and V2, a clear signal CLRz, and the like described below. In the present embodiment, the gate driver including the first and second gate drivers 410 and 420 operates by twelve-phase clock signals including the first to twelfth gate clock signals CK1 to CK12. Note that, the number of phases of the gate clock signal is not limited to twelve. By increasing the number of phases of the gate clock signal, the number of stages (number of output transistors) in which the same gate clock signal CKk is supplied can be reduced and the power consumption can be reduced, but when the number of phases is increased, the number of signal lines for supplying the gate clock signals is increased and the frame region is increased in the display panel 600 serving as the GDM panel.

Figure 3:
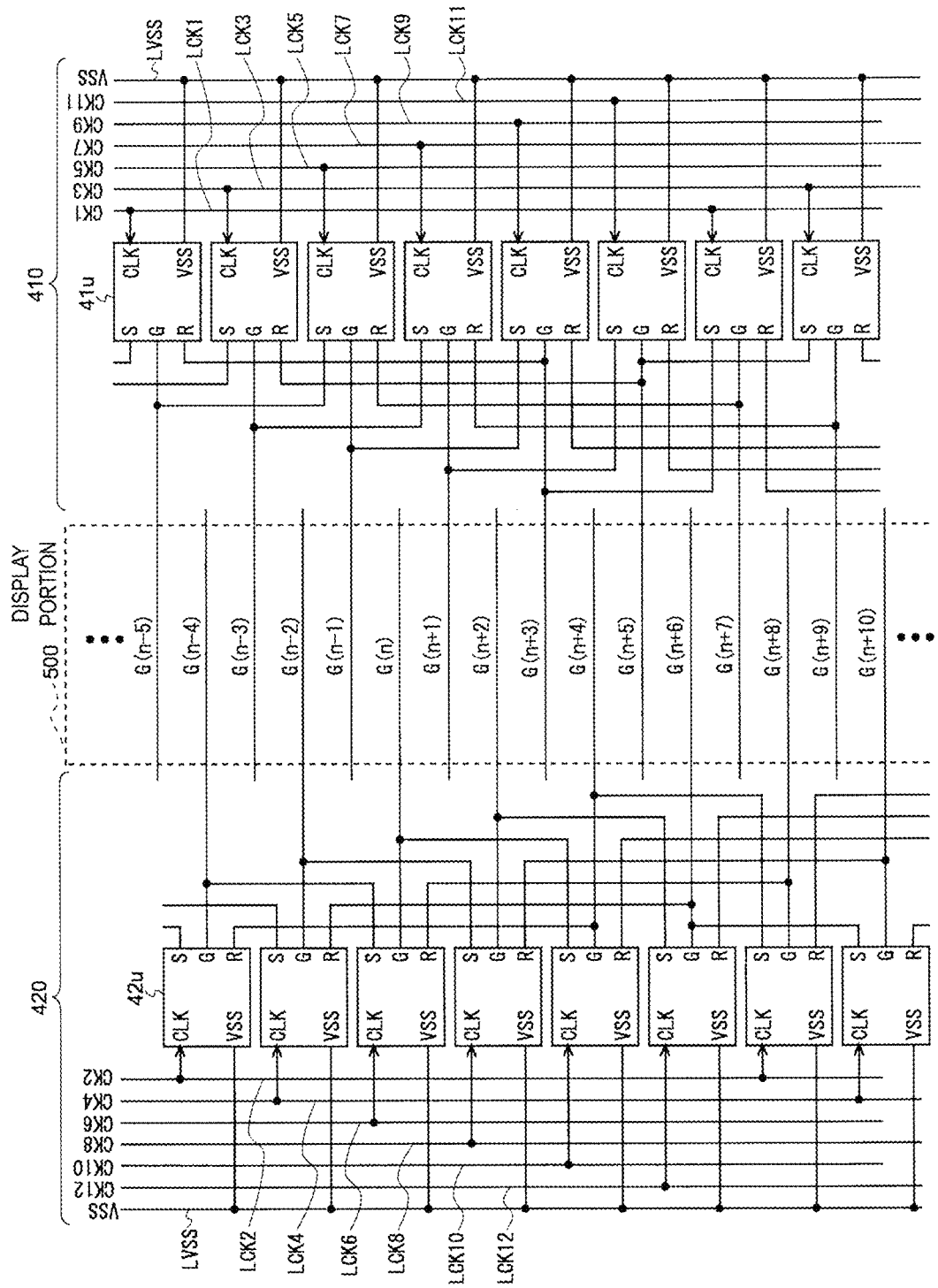
FIG. 3 is a circuit diagram for describing a configuration of a gate driver in the first embodiment.

Note that in the frame region, clock signal lines LCK1 to LCK12 for supplying the first to twelfth gate clock signals CK1 to CK12 to the first and second gate drivers 410 and 420 are arranged, and low-voltage power source lines LVSS for supplying low-voltage power supply voltages VSS among high-voltage power supply voltages VDD and the low-voltage power supply voltages VSS in the display device 100 to the first and second gate drivers 410 and 420 are arranged (see FIG. 3 described below). The high-voltage power supply voltage VDD corresponds to a gate high voltage (H level), which is a voltage for turning an N-channel type transistor (N-channel type TFT) 10 serving as a pixel switching element in the pixel forming section Ps to an on state, and the low-voltage power supply voltage VSS corresponds to a gate low voltage (L level), which is a voltage for turning the N-channel type transistor 10 in the pixel forming section Ps to an off state.

The data driver 300 applies data signals D1 to DM to the data lines DL1 to DLM, respectively, based on the digital video signal DV and the data side control signal SCT from the display control circuit 200. At this time, the digital video signals DV indicating voltages each to be applied to a respective one of the data lines DL are sequentially held in the data driver 300 at a timing when a pulse of the data clock signal is generated. Then the held digital video signals DV are converted into analog voltages at a timing when a pulse of the latch strobe signal is generated. The converted analog voltages are simultaneously applied, as data signals D1 to DM, to all of the data lines DL1 to DLM.

The first gate driver 410 is arranged on one end side of the gate lines GL1 to GLN, and applies odd-numbered scanning signals G(1), G(3), G(5), . . . , to odd-numbered gate lines GL1, GL3, GL5, . . . , respectively, based on the first scanning side control signal GCT1 from the display control circuit 200. On the other hand, the second gate driver 420 is arranged on the other end side of the gate lines GL1 to GLN, and applies even-numbered scanning signals G(2), G(4), G(6), . . . , to even-numbered gate lines GL2, GL4, GL6, . . . , respectively, based on the second scanning side control signal GCT2 from the display control circuit 200. Accordingly, each of the active scanning signals is sequentially applied to a respective one of the gate lines GL1 to GLN in each frame period, and the application of the active scanning signal to each gate line GLi (i=1 to N) is repeated with one frame period as a cycle.

A backlight unit (not illustrated) is provided on a back face side of the display panel 600, so that the back face of the display panel 600 is irradiated with backlight. The backlight unit is also driven by the display control circuit 200, but may be configured to be driven by another method. Note that when the display panel 600 is a reflective type liquid crystal panel, the backlight unit is not necessary.

As described above, the data signals D1 to DM are applied to the data lines DL1 to DLM, respectively, and the scanning signals G(1) to G(N) are applied to the gate lines GL1 to GLN, respectively. A predetermined common voltage Vcom is supplied to the common electrode Ec from power source circuit (not illustrated). Further, a signal for driving the backlight is supplied to the backlight. By driving the data lines DL1 to DLM, the gate lines GL1 to GLN, the common electrodes Ecs, and the backlights in the display portion 500 in this way, pixel data based on the digital video signal DV is written into each pixel forming section Ps(i, j), light is emitted from the backlight to the back face of the display panel 600, and thus an image represented by the image signal DAT applied from the outside is displayed on the display portion 500.

1.2 Overall Configuration of Gate Driver

Next, the gate driver in the present embodiment will be described below in detail. In the present embodiment, all transistors constituting the gate driver are N-channel type thin film transistors.

FIG. 3 is a circuit diagram illustrating an overall configuration of the gate driver according to the present embodiment. As illustrated in FIG. 3, the first gate driver 410 includes a plurality of unit circuits 41u in one to one correspondence with the odd-numbered gate lines GL1, GL3, . . . , GLn−1, GLn+1, . . . , in the display portion 500 (here, n is an even number). A drive output terminal G of each unit circuit 41u is connected to a corresponding gate line GLi1 (i1 is an odd number), and a scanning signal G(i1) is applied to the corresponding gate line GLi1 from the drive output terminal G (i1=1, 3, . . . , n−1, n+1, . . . ). As illustrated in FIG. 3, the second gate driver 420 includes a plurality of unit circuits 42u in one to one correspondence with the even-numbered gate lines GL2, GL4, . . . , GLn, GLn+2, . . . , in the display portion 500. The drive output terminal G of each unit circuit 42u is connected to a corresponding gate line GLi2 (i2 is an even number), and a scanning signal G(i2) is applied to the corresponding gate line GLi2 from the drive output terminal G (i2=2, 4, . . . , n, n+2, . . . ).

In the following, in a case where a unit circuit of interest is referred to as an "own stage" to specify another unit circuit, a unit circuit corresponding to a gate line GLn−j that is j lines before the gate line GLn corresponding to the unit circuit of the own stage is referred to as a "unit circuit of j stages before in the gate driver" or simply a "unit circuit of j stages before", and a unit circuit corresponding to a gate line GLn+k that is k lines after the gate line GLn corresponding to the unit circuit of the own stage is referred to as a "unit circuit of k stages after in the gate driver" or simply a "unit circuit of k stages after". For example, when a unit circuit corresponding to an n-th gate line GLn in the second gate driver 420 is a own stage (n is an even number), a unit circuit of four stages before in the gate driver is a unit circuit corresponding to the gate line GLn−4, is a unit circuit of two stages before in a shift resister constituting the second gate driver 420, and outputs the scanning signal G(n−4). In the following, k unit circuits corresponding to the last k gate lines GLN−k+1, GLN−k+2, . . . , GLN−1, GLN among the N gate lines GL1 to GLN arranged on the display portion 500 are referred to as "unit circuits of the last k stages in the gate driver" or simply "unit circuits of the last k stages". For example, unit circuits of the last eight stages in the gate driver are eight unit circuits corresponding to eight gate lines GLN−7, GLN−6, GLN−5, . . . , GLN−1, and GLN, and include unit circuits of the last four stages in the shift register constituting the first gate driver 410 (four stages adjacent to each other including the final stage) and unit circuits of the last four stages in the shift register constituting the second gate driver 420 (four stages adjacent to each other including the final stage).

In the first gate driver 410, each of the plurality of unit circuits 41u functions as a bistable circuit, and the plurality of unit circuits 41u are cascade-connected to each other as illustrated in FIG. 3 to constitute the shift register. Each of the first, third, fifth, seventh, ninth, and eleventh clock signals CK1, CK3, CK5, CK7, CK9, and CK11 among the gate clock signals (hereinafter, also referred to as simply "clock signals") CK1 to CK12 constituting the twelve-phase clock signals is cyclically corresponding to a respective one of these cascade-connected unit circuits, and corresponding clock signal CKx is input to each unit circuit 41u in the shift register. Each unit circuit 41u includes a set terminal S, a reset terminal R, and a clock terminal CLK serving as input terminals, includes a drive output terminal G serving as an output terminal, and includes a reference power supply terminal VSS serving as a power supply terminal (a reference power supply voltage is denoted by the same reference numeral "VSS" as the low-voltage power supply voltage described above). Among these terminals in the unit circuit 41u, the set terminal S is connected to the drive output terminal G of the unit circuit 41u of four stage before in the gate driver, the reset terminal R is connected to the drive output terminal G of the unit circuit 41u of eight stages after in the gate driver, the clock terminal CLK is connected to the clock signal line LCKx for supplying the gate clock signal CKx corresponding to the unit circuit 41u among the clock signal lines LCK1 to LCK12, the reference power supply terminal VSS is connected to the low-voltage power source line LVSS, and the drive output terminal G is connected to the gate line GLi1 corresponding to the unit circuit (i1 is an odd number).

In the second gate driver 420, each of the plurality of unit circuits 42u functions as the bistable circuit, and the plurality of unit circuits 42u are cascade-connected to each other as illustrated in FIG. 3 to constitute the shift register. Each of the second, fourth, sixth, eighth, tenth, and twelfth clock signals CK2, CK4, CK6, CK8, CK10, and CK12 among the clock signals CK1 to CK12 constituting the twelve-phase clock signals is cyclically corresponding to a respective one of these cascade-connected unit circuits. Similarly to the unit circuits 41u in the first gate driver 410, each unit circuit 42u includes the set terminal S, the reset terminal R, and the clock terminal CLK serving as input terminals, includes the drive output terminal G serving as the output terminal, and includes the reference power supply terminal VSS serving as the power supply terminal. Among these terminals in the unit circuit 42u, the set terminal S is connected to the drive output terminal G of the unit circuit 42u of four stage before, the reset terminal R is connected to the drive output terminal G of the unit circuit 42u of eight stages after, the clock terminal CLK is connected to the clock signal line LCKx for supplying the gate clock signal CKx corresponding to the unit circuit 42u among the clock signal lines LCK1 to LCK12, the reference power supply terminal VSS is connected to the low-voltage power source line LVSS, and the drive output terminal G is connected to the gate line GLi2 corresponding to the unit circuit (i2 is an even number). Note that as will be described later, the unit circuits 41u in the first gate driver 410 and the unit circuits 42u in the second gate driver 420 have the same configuration.

In the gate driver configured as described above, the shift register constituted by the plurality of unit circuits 41u in the first gate driver 410 sequentially transfers pulses of the first gate start pulse signal GSP1 serving as the first input signal in each frame period, and sequentially applies each of the active scanning signals (H level signals) to a respective one of the odd-numbered gate lines GL1, GL3, GL5, . . . , of the display portion 500 in response to the pulse. The shift register constituted by the plurality of unit circuits 42u in the second gate driver 420 sequentially transfers pulses of the second gate start pulse signal GSP2 serving as the first input signal in each frame period, and sequentially applies each of the active scanning signals (H level signals) to a respective one of the even-numbered gate lines GL2, GL4, GL6, . . . , of the display portion 500 in response to the pulse. Accordingly, each of the gate lines GL1 to GLN in the display portion 500 sequentially turns to a select state for each predetermined period (for each horizontal period) in each frame period. As a result, each gate line GLi (i=1 to N) in the select state turns to the H level and a state in which the charge is accumulated (in a wiring line capacitance of the gate line).

1.3 Basic Configuration of Unit Circuit

A configuration of unit circuits that can be used in the first and second gate drivers 410 and 420 configured as illustrated in FIG. 3 will be described. Before describing the configuration of the unit circuits used in the present embodiment, first, the configuration of the unit circuit serving as a basis of the configuration (hereinafter, also referred to as a "basic unit circuit") will be described. In the following, the unit circuit 41*u* in the first gate driver 410 and the unit circuit 42*u* in the second gate driver 420 have the same configuration, and are denoted by the same reference numerals instead of "41*u*" and "42*u*" for these unit circuits 41*u* and 42*u*.

Figure 4:
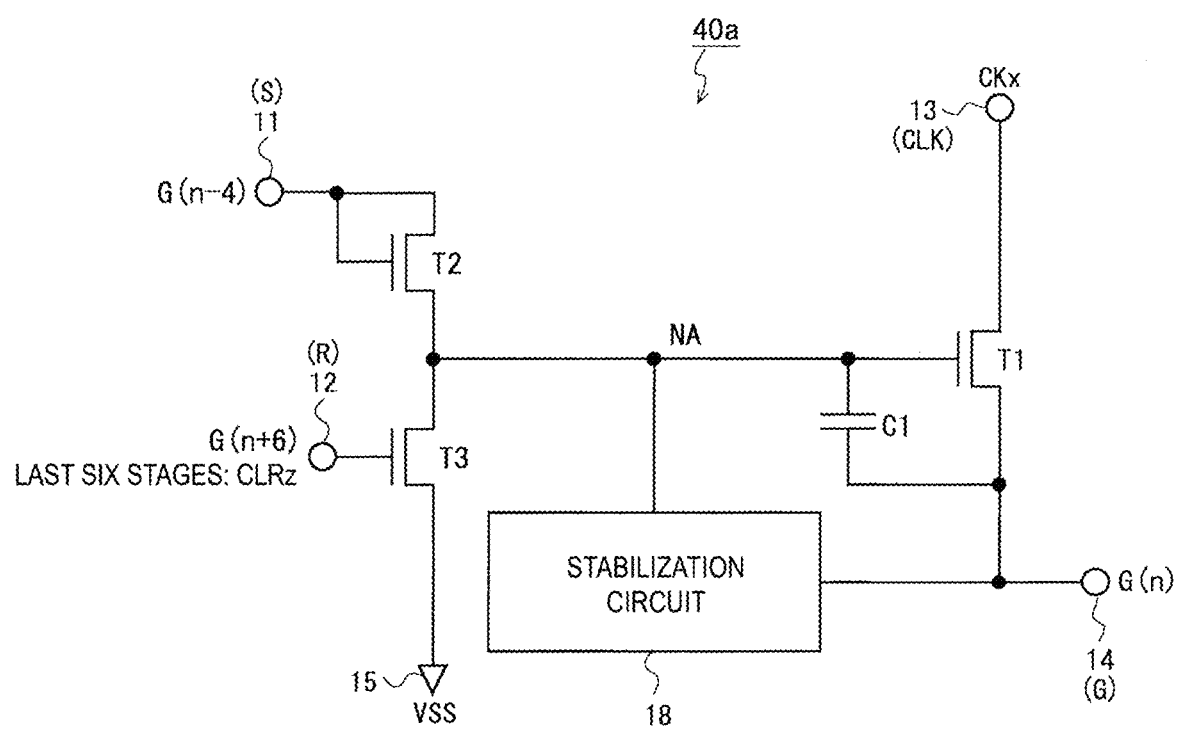
FIG. 4 is a circuit diagram illustrating a configuration example of a unit circuit of the gate driver.

FIG. 4 is a circuit diagram illustrating a configuration example of a basic unit circuit 40*a* that can be used as the unit circuits 41*u* and 42*u* in the first and second gate drivers 410 and 420. The unit circuit 40*a* includes input terminals 11, 12, and 13, an output terminal 14, and the power supply terminal 15, and includes three transistors T1 to T3, one capacitor C1, and the stabilization circuit 18. The input terminal 11 corresponds to the set terminal S serving as a terminal for receiving the set signal, and the input terminal 12 corresponds to the reset terminal R serving as a terminal for receiving the reset signal, the input terminal 13 corresponds to the clock terminal CLK serving as a terminal for receiving the clock signal, the output terminal 14 corresponds to the drive output terminal G serving as a terminal for outputting the output signal of the unit circuit 40*a* as the scanning signal, and the power supply terminal 15 corresponds to the reference power supply terminal VSS serving as a terminal for receiving the low-voltage power supply voltage. The transistors T1 to T3 are N-channel type transistors.

As illustrated in FIG. 4, the transistor T2 includes a drain terminal and a gate terminal connected to the input terminal 11 and a source terminal connected to a drain terminal of the transistor T3. The transistor T3 includes a gate terminal connected to the input terminal 12 and a source terminal connected to the reference power supply terminal VSS. The transistor T1 includes a drain terminal connected to the input terminal 13, and a source terminal connected to the output terminal 14 and connected to the gate terminal via the capacitor C1. In this unit circuit 40*a*, the gate terminal of the transistor T1, the source terminal of the transistor T2, and the drain terminal of the transistor T3 are connected to each other to constitute the internal node NA. The internal node NA is a node for holding a voltage in which the unit circuit 40*a* indicates a state as the bistable circuit. In the unit circuit 40*a*, the transistor T2 connected as described above constitutes a set circuit, the transistor T3 connected as described above constitutes a reset circuit, and the transistor T1 and the capacitor C1 connected as described above constitutes an output circuit (the same applies to the unit circuit in each embodiment described later). Note that the first terminal and second terminal of the capacitor C1 are connected to the gate terminal and source terminal of the output transistor T1, respectively, and thus the capacitor C1 functions as a so-called bootstrap capacitor.

Figure 22:
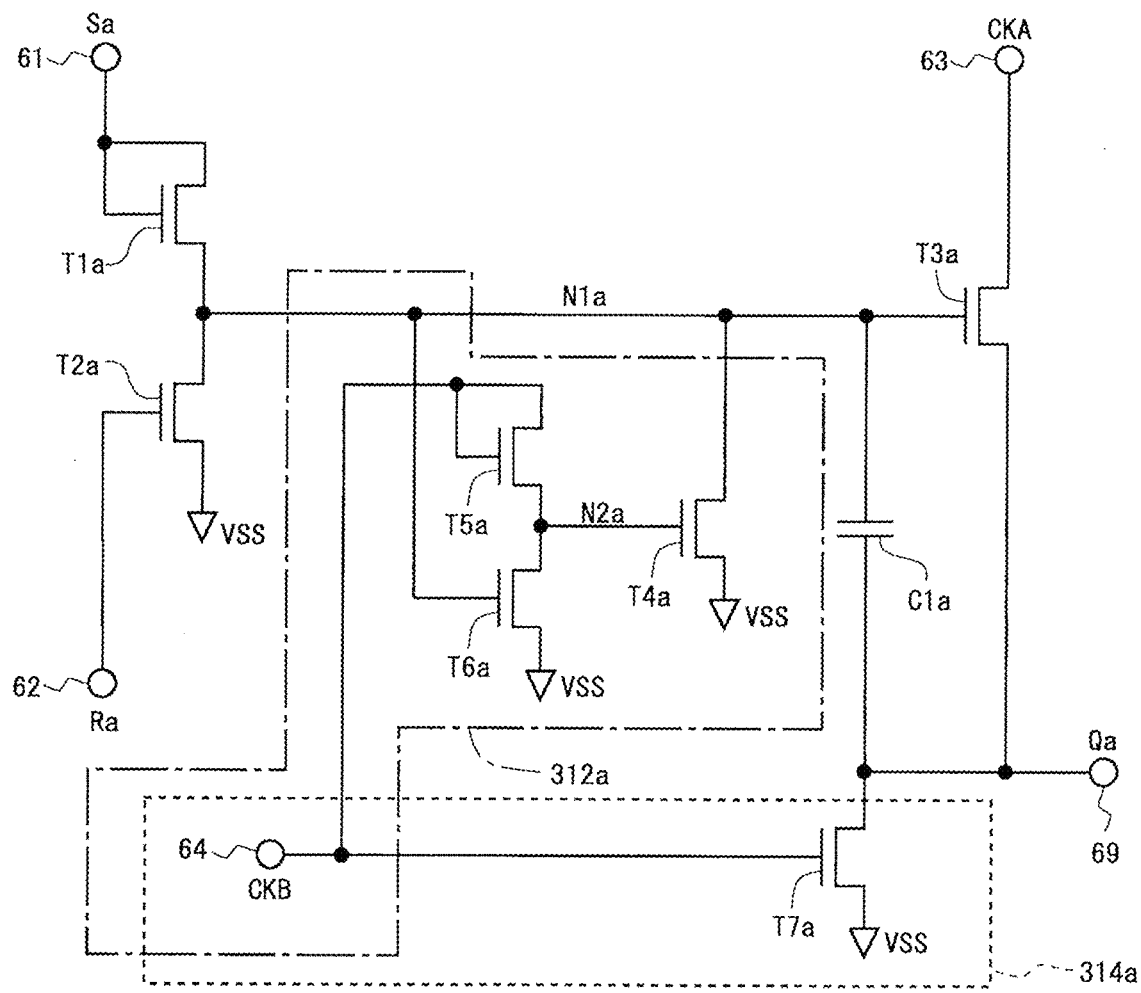
FIG. 22 is a circuit diagram for describing a configuration example of a stabilization circuit included in a unit circuit of a gate driver.

In the unit circuit 40*a*, the stabilization circuit 18 is connected to the internal node NA and the output terminal 14. The stabilization circuit 18 can be implemented, for example, by a first output control node stabilizing unit 312*a* and a first output node stabilizing unit 314*a* in the unit circuit described in FIG. 22. In the unit circuit illustrated in FIG. 22, the first output control node stabilizing unit 312*a* is provided in order to maintain a potential of the node N1*a* at the low level during the non-select period serving as a period other than a period when the gate line connected to the unit circuit is in the select state, and the first output node stabilizing unit 314*a* is provided in order to maintain a potential of an output signal Qa (potential of an output terminal 69) at the low level during the non-select period by a transistor T7*a*.

1.4 Basic Operation of Gate Driver

Figure 6:
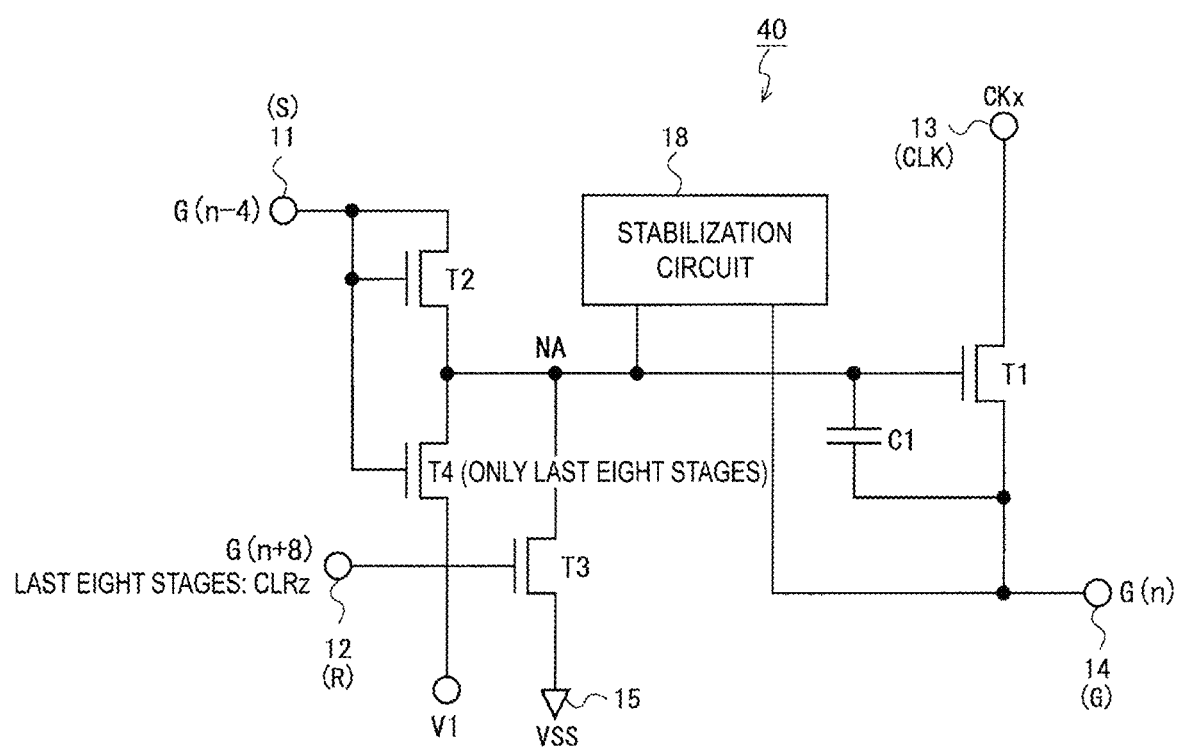
FIG. 6 is a circuit diagram illustrating a configuration of a unit circuit of the gate driver in the first embodiment.

Next, the operation of the gate driver including the first and second gate drivers 410 and 420 configured as illustrated in FIG. 3 in the present embodiment will be described. The unit circuit used in the gate driver according to the present embodiment is configured as illustrated in FIG. 6 described below, but even when the unit circuit 40*a* having the configuration illustrated in FIG. 4 is used, the operation of the gate driver is basically the same. Thus, in the following, the operation of the gate driver will be described on the assumption that the unit circuit 40*a* illustrated in FIG. 4 is used as the unit circuits 41*u* and 42*u* illustrated in FIG. 3. Note that, in the gate driver of the present embodiment illustrated in FIG. 3, the reset terminal R in the unit circuit 40 is connected to the output terminal G of the unit circuit 40 of eight stages after and receives the output signal G(n+8), and on the other hand in the gate driver using the unit circuit 40*a* in FIG. 4, the reset terminal R in the unit circuit 40*a* is connected to the output terminal G of the unit circuit 40*a* of six stages after and receives the output signal G(n+6). Based on this difference, a difference in the operation of the gate driver will be described later.

Note that in the following, a unit circuit corresponding to a 2k-12p-1-th gate line GL2*p*−1 among the unit circuits 41*u* in the first gate driver 410 is denoted by reference numerals "41(2p-1)", "40*a*(2p-1)", or "40(2p-1)", and a unit circuit corresponding to a 2p-th gate line GL2*p* among the unit circuits 42*u* in the second gate driver 420 is denoted by reference numerals "42(2p)", "40*a*(2p)", or "40(2p)" (p=1, 2, 3, . . . ).

Figure 5:
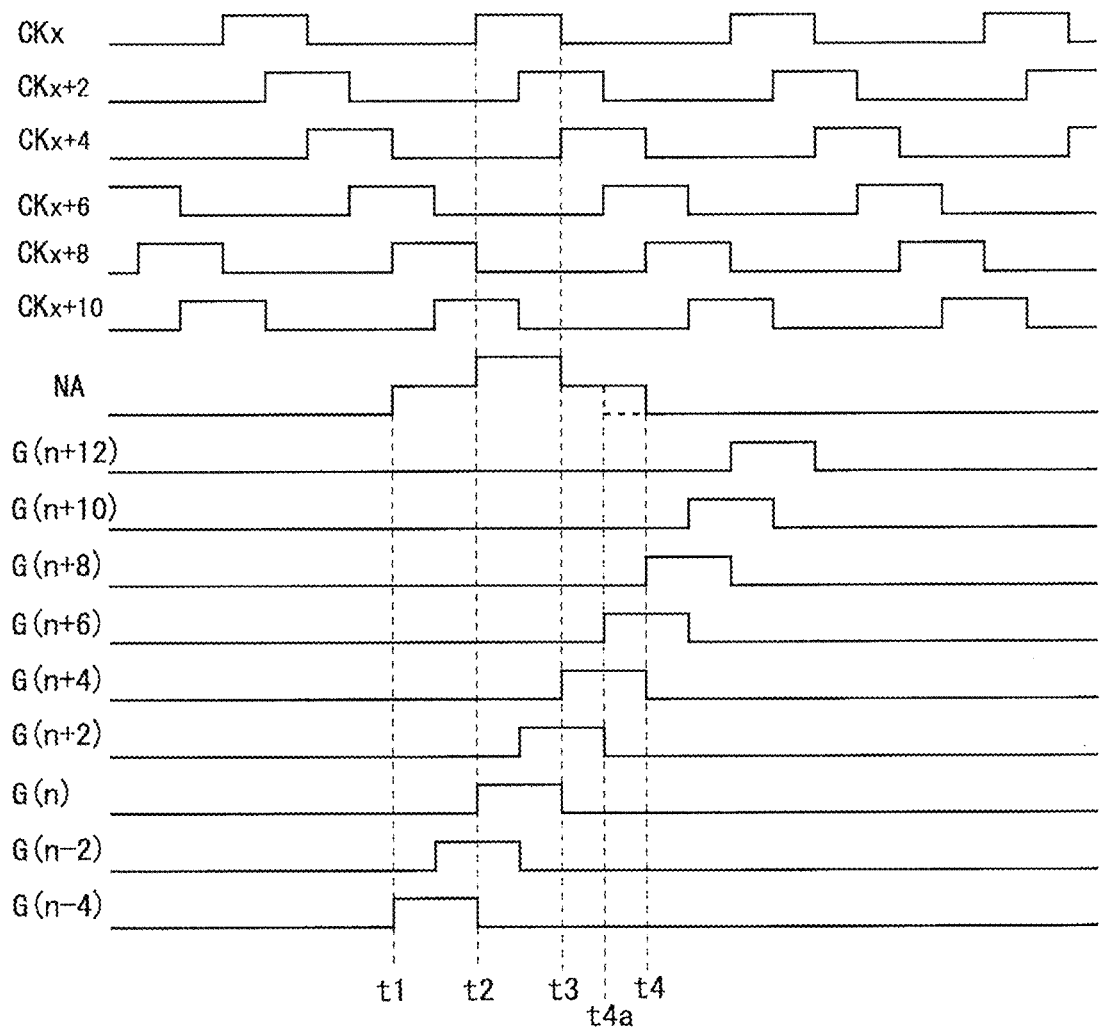
FIG. 5 is a signal waveform diagram for describing an operation of the gate driver in the first embodiment.

FIG. 5 is a signal waveform diagram for describing operations of the gate driver having configuration illustrated in FIG. 3. Here, the twelve-phase clock signals including the first to twelfth clock signals CK1 to CK12 are generated by the display control circuit 200. Among the twelve-phase clock signal, the first, the third, . . . , the eleventh clock signals CK1, CK3, . . . , CK11 are supplied to the shift register constituting the first gate driver 410, and the second, the fourth, . . . , the twelfth clock signals CK2, CK4, . . . , CK12 are supplied to the shift register constituting the second gate driver 420. As illustrated in FIG. 5, a unit circuit 41*u*(*n*) corresponding to the n-th gate line GLn among the unit circuits 41*u* constituting the shift register of the first gate driver 410 includes the clock terminal CLK to which the x-th clock signal CKx is applied, and a unit circuit 42*u*(*n*+1) corresponding to the n+1-th gate line GLn+1 among the unit circuits 42*u* constituting the shift register of the second gate driver 420 includes the clock terminal CLK to which the (x+1)-th clock signal CKx+1 is applied (x=6 in the configuration illustrated in FIG. 3). Note that, when each clock signal CKp (p is any of 1 to 12) constituting the twelve-phase clock signals is indicated by reference numeral "CKx+j", "CKx+j" is to be considered as "CKx+j−12" when x+j>12 (the same applies to FIG. 5).

Now, attention is focused on the unit circuit $42u(n)$ corresponding to the n-th gate line GLn among the unit circuits $42u$ in the second gate driver 420, and an operation will be considered in a case where a pulse of the scanning signal G(n−4) serving as the output signal from the output terminal G of the unit circuit $42u(n-4)$ of four stages before is input to the set terminal S of the unit circuit $41u(n)$ in a state in which the internal node NA is at the L level.

As illustrated in FIG. 5, the output signal G(n−4) of the unit circuit $41u(n-4)$ of four stages before input to the input terminal 11 serving as the set terminal S of the unit circuit $42u(n)$ of interest is changed from the L level to the H level at time t1, and thus the transistor T2 turns to the on state, and the internal node NA is charged. As a result, the voltage of the internal node NA turns to the H level, and thus the transistor T1 turns to the on state. When the transistor T1 turns to the on state, the clock signal (hereinafter, also referred to as an "input clock signal") CKx applied to the input terminal 13 serving as the clock terminal CLK is output from the output terminal 14 serving as the drive output terminal G to the gate line GLn as the scanning signal G(n). This clock signal CKx changes from the L level to the H level at time t2, so that the voltage of the internal node NA is pushed up via the capacitor C1 to turn to a voltage higher than the H level. As a result, the transistor T1 turns to completely on state, and the voltage of the scanning signal G(n) output to the gate line GLn turns to completely the H level.

Thereafter, at time t3, the clock signal (input clock signal) CKx applied to the input terminal 13 changes from the H level to the L level, so that the scanning signal G(n) output from the output terminal 14 to the gate line GLn changes from the H level to the L level. Additionally, the potential of the internal node NA decreases in response to the change of the clock signal CKx from the H level to the L level.

In a case where the unit circuit 40a in FIG. 4 is used as the unit circuit $42u(n)$, the output signal G(n+6) of the unit circuit $42u(n+6)$ of six stages after is applied to the input terminal 12 serving as the reset terminal R of the unit circuit $42u(n)$. Thus, at the subsequent time t4a, the voltage of the reset terminal R of the unit circuit $42u(n)$ changes from the L level to the H level. As a result, the transistor T3 turns to the on state, and the voltage of the internal node NA is discharged to turn to the L level (see a dotted line portion of the voltage waveform of the internal node NA illustrated in FIG. 5). In contrast, in a case where the unit circuit 40 (see FIG. 6 described below) of the present embodiment is used as the unit circuit $42u(n)$, the output signal G(n+8) of the unit circuit $42u(n+8)$ of eight stages after is applied to the input terminal 12 serving as the reset terminal R of the unit circuit $42u(n)$. Thus, at the subsequent time t4, the voltage of the reset terminal R of the unit circuit $42u(n)$ changes from the L level to the H level. As a result, the transistor T3 turns to the on state, and the voltage of the internal node NA is discharged to turn to the L level (see a solid line portion of the voltage waveform of the internal node NA illustrated in FIG. 5).

Note that in a case where the unit circuit of the succeeding stage for outputting the signal G(n+6) or G(n+8) to be applied to the reset terminal R of the unit circuit $42u(n)$ of interest is not included in the second gate driver 420, that is, in a case where the unit circuit $42u(n)$ corresponds to any of the last six stages in the gate driver using the unit circuit 40a in FIG. 3, or corresponds to any of the last eight stages in the gate driver using the unit circuit 40 in FIG. 6 described later, that is, the gate driver in the present embodiment, the clear signal CLRz serving as a second input signal is applied to the reset terminal R. In this case, at the time when the clear signal CLRz changes from the L level to the H level, the transistor T3 turns to the on state, and the voltage of the internal node NA is discharged to turn to the L level. Here, the clear signal CLRz is a signal which turns to the H level only for a predetermined period after the output signal G(n) of the unit circuit $42u(n)$ of the own state changes to the L level in each frame period (details described below).

With the operation of the unit circuit $42u(n)$ as described above, the gate line GLn changes from the non-select state (L level) to the select state (H level) at the time t2, maintains the select state (H level) from the time t2 to the time t3, and changes from the select state (H level) to the non-select state (L level) at the time t3.

Each of the other unit circuits $42u$ in the second gate driver 420 also operates in the similar manner according to each signal input to a corresponding one of the set terminal S, the reset terminal R, and the clock terminal CLK of each one of the other unit circuits $42u$. As a result, in the second gate driver 420, the pulses of the second gate start pulse signal GSP2 applied to the set terminal in the unit circuit of the first stage are sequentially transferred by the shift register configured by the unit circuits $42u$, and thus the even-numbered gate lines GL2, GL4, GL6, . . . , are sequentially selected for each predetermined period.

Also in the first gate driver 410, each of the unit circuits $41u$ operates in the similar manner according to each signal input to a corresponding one of the set terminal S, the reset terminal R, and the clock terminal CLK of each one of the unit circuits $41u$. As a result, in the first gate driver 410, the pulses of the first gate start pulse signal GSP1 applied to the set terminal in the unit circuit of the first stage are sequentially transferred by the shift register configured by the unit circuits $41u$, and thus the odd-numbered gate lines GL1, GL3, GL5, . . . , are sequentially selected for each predetermined period.

When the timings of the first and second gate start pulse signals GSP1 and GSP2 are appropriately set, the gate lines GL1 to GLN in the display portion 500 are sequentially selected for each predetermined period by the operations of the first and second gate drivers 410 and 420 as described above.

Note that the stabilization circuit 18 included in each unit circuit $41u$, $42u$ (40a) is for stabilizing the operation in the gate driver as described above, and its configuration and function are well known, but is not directly related to the basic operation of the gate driver. Thus, description of the operation of the stabilization circuit 18 in detail is omitted. Although FIG. 4 illustrates the basic configuration of the unit circuit in each embodiment, the specific circuit configuration may be partially changed without substantially changing the function of the unit circuit in FIG. 4, or the circuit configuration after such a modification may be the basic configuration of the unit circuit 40 in each embodiment.

1.5 Configuration of Unit Circuit in First Embodiment

As described above, there is known the configuration in which the stabilization circuit 18 is provided in order to prevent the voltage fluctuation of the internal node NA during a period (output off period) when the output transistor T1 is to be maintained in the off state in the unit circuit (see FIG. 4). However, the TFT (thin film transistor) included in the stabilization circuit 18 may deteriorate earlier than the TFT constituting the shift register, and when the TFT of the stabilization circuit 18 deteriorates, the voltage of the internal node NA cannot be reliably maintained at the level (voltage VSS) where the output transistor T1 is in the off state, and thus the output transistor T1 is more likely to malfunction due to the influence of noise. Thus, the unit circuit in the present embodiment has a configuration for suppressing the voltage fluctuation of the internal node NA in the output off period of the unit circuit even when the stabilization circuit 18 does not normally function.

FIG. 6 is a circuit diagram illustrating a configuration of the unit circuit 40 in the present embodiment. Similarly to the basic unit circuit 40a illustrated in FIG. 4, the unit circuit 40 includes the input terminal 11 serving as the set terminal S, the input terminal 12 serving as the reset terminal R, the input terminal 13 serving as the clock terminal CLK, the power supply terminal 15 serving as the reference power supply terminal VSS, and the output terminal 14 serving as the drive output terminal G, and includes the transistors T1, T2, and T3, the capacitor C1, and the stabilization circuit 18, which are connected similarly to that of the basic unit circuit 40a in FIG. 4. Also in the unit circuit 40, the gate terminal of the transistor T1, the source terminal of the transistor T2, and the drain terminal of the transistor T3 are connected to each other to constitute the internal node NA.

In addition, in the present embodiment, a transistor T4 is provided in each unit circuit 40 of the last eight stages in the gate driver, as illustrated in FIG. 6. The transistor (hereinafter referred to as a "compensation transistor") 14 includes a drain terminal connected to the internal node NA, a source terminal connected to a control signal line for supplying a first compensation stop signal V1 described later, and a gate terminal connected to the input terminal 11 serving as the set terminal S. The unit circuits 40 other than the unit circuits 40 of the last eight stages are not provided with such a compensation transistor T4. The compensation transistor T4 connected in this manner constitutes the compensation circuit using the compensation stop signal V1 described below.

1.6 Operation of Gate Driver in First Embodiment

In the gate driver according to the present embodiment, the unit circuit 40 in FIG. 6 is used as the unit circuits 41u and 42u in the configuration illustrated in FIG. 3. The basic operation of this gate driver is similar to the operation in the case where the unit circuit 40a in FIG. 4 is used as the unit circuits 41u and 42u in the configuration illustrated in FIG. 3, and is as already described above with reference to FIG. 5. In the following, attention is focused on the unit circuits 40(n) included in the second gate driver 420 among the unit circuits 40 of the last eight stages in the gate driver, and a characteristic operation of the gate driver in the present embodiment will be described (n is an even number satisfying N−7≤n≤N).

In the unit circuits 40(n) included in the second gate driver 420 among the unit circuits 40 of the last eight stages in the gate driver, as illustrated in FIG. 6, the output signal G(n−4) of unit circuit 40(n−4) of four stages before (unit circuit of two stages before in the shift register constituting the second gate driver 420) is applied to the input terminal 11 serving as the set terminal S, a clear signal CLRz described later is applied to the input terminal 12 serving as the reset terminal R, and a corresponding clock signal CKx among the twelve-phase clock signals is applied to the input terminal 13 serving as the clock terminal CLK. The compensation stop signal V1 described below is applied to the source terminal of the compensation transistor T4. Note that in the unit circuits 40 other than the last eight stages among the unit circuits 40 in the second gate driver 420, the output signal G(n+8) of a unit circuit 40(n+8) of eight stages after (unit circuit of four stages after in the shift register constituting the second gate driver 420) is applied to the input terminal 12 serving as the reset terminal R.

The characteristic operation of the gate driver in the present embodiment is based on the operation of the compensation transistor T4 in the unit circuit 40(n), but the operation and function of the transistor T3 will be described first prior to describing the operation and the function of the compensation transistor T4.

In any of the unit circuits 40(n) in the second gate driver 420, in a case where the stabilization circuit 18 does not normally function, the internal node NA starts to be charged by the output signal G(n−4) via the transistor T2 in a direction in which the voltage increased, when the output signal G(n−4) of the preceding stage applied to the input terminal 11 becomes higher than the voltage of the internal node NA (more precisely, when becoming higher than the voltage of the internal node NA by a threshold voltage of the transistor T2 or more) during a period other than a period when the H level voltage (VDD) for allowing the corresponding gate line GLn to turn to the select state is to be supplied. In a case where the unit circuit 40(n) is not included in the last eight stages, the output signal G(n+8) of the succeeding stage is applied to the input terminal 12 connected to the gate terminal of the transistor T3. Here, an identical clock signal CKy among the twelve-phase clock signals is input to the transistor T1 of the unit circuit 40(n−4) of the preceding stage for outputting the signal G(n−4) applied to the input terminal 11, and to the transistor T1 of the unit circuit 40(n+8) of the succeeding stage for outputting the signal G(n+8) applied to the input terminal 12. Thus, in these unit circuits 40(n−4), even in a case where the stabilization circuit 18 does not normally function, and a leakage current is generated in the transistor T1, and thus the voltage of the corresponding gate line GLn−4 is higher than the voltage of the internal node NA in the unit circuit 40(n), a leakage current is generated in the transistor T3 at the same timing as the timing when the signal G(n−4) applied to the input terminal 11 affects the voltage of internal node NA. Thus, in the unit circuit 40(n), the voltage of the internal node NA can be brought close to the L level voltage VSS. In other words, during a period other than a period when the H level voltage VDD is to be applied to the gate line GLn (in an output off period that is a period when the internal node NA is to be maintained in the non-active state (L level)), the voltage fluctuation of the internal node NA generated by the output signal G(n−4) of the preceding stage input from the input terminal 11 can be suppressed by the transistor T3 including a gate terminal to which the output signal G(n+8) of the succeeding stage is applied.

Figure 8:
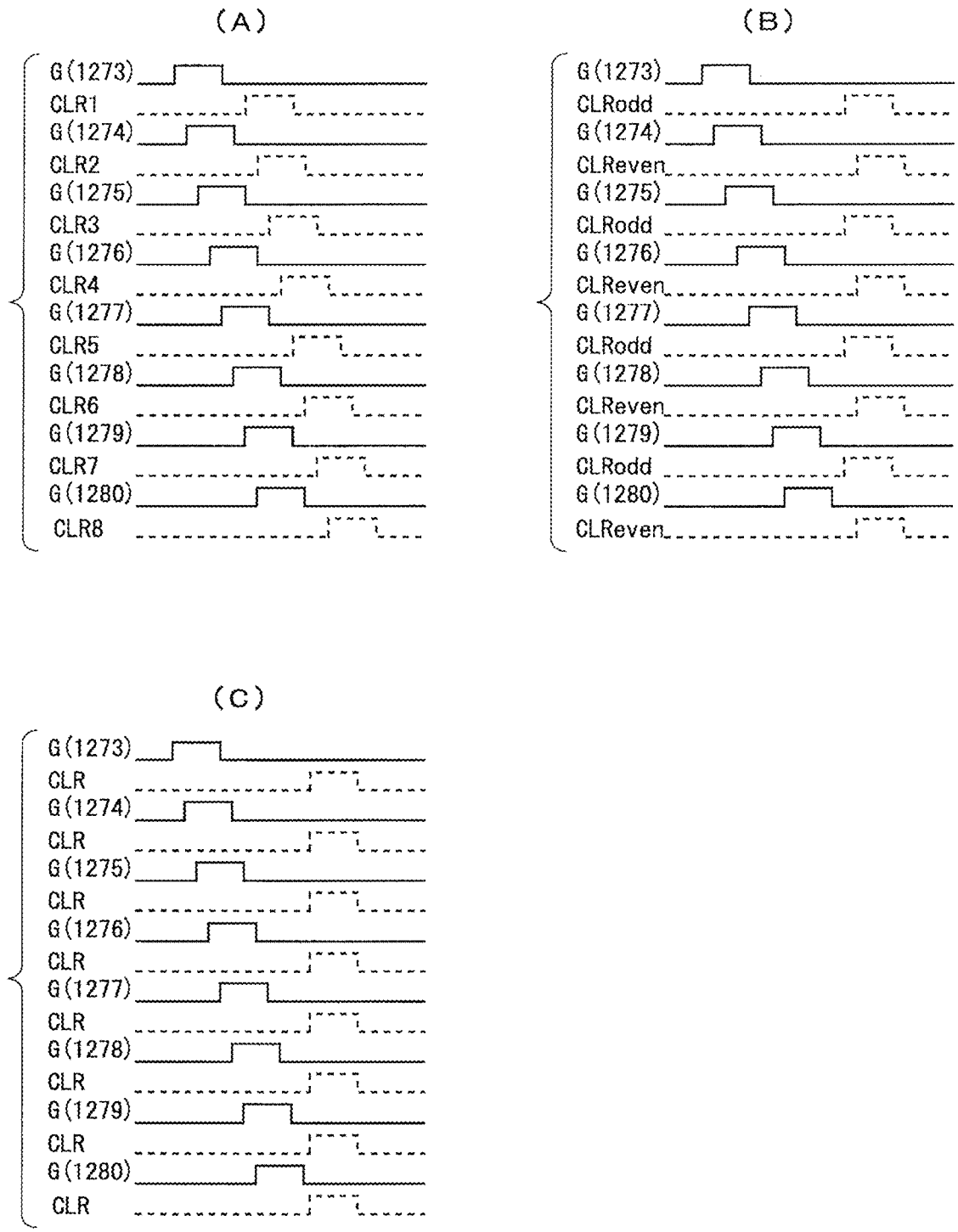
FIG. 8 is a timing chart illustrating clear signals to be input to the unit circuits of the last eight stages in the gate driver in the first embodiment.

On the other hand, in a case where the unit circuit 40(n) is included in the last eight stages, the clear signal CLRz instead of the output signal G(n+8) of the succeeding stage is applied to the input terminal 12 to which the gate terminal of the transistor T3 is connected, as illustrated in FIG. 6. The clear signal CLRz is a signal that turns to the H level (active state) only for a predetermined period after the output signal G(n) of the own stage changes to the L level (non-active state), and the clear signal CLRz input to the unit circuit 40 of each stage may be the same or different. As the clear signal CLRz, for example, a signal illustrated in any timing chart of (A) to (C) in FIG. 8 can be used, in a case where the number of gate lines is N=1280. In FIG. 8, the waveform of the clear signal CLRz input to the unit circuit 40(*k*) outputting the scanning signal G(k) is indicated by a dotted line immediately after the waveform of the scanning signal G(k) (k=1273 to 1280). (A) in FIG. 8 illustrates an example in which the clear signals CLR1 to CLR7 input to the unit circuits 40(1273) to 40(1280) of the last eight stages in the gate driver, respectively, are different from each other. (B) in FIG. 8 illustrates an example in which the clear signals input to the unit circuits 40(1273) to 40(1280) of the last eight stages include two types, i.e., a clear signal CLRodd to be input to a unit circuit corresponding to an odd-numbered gate line and a clear signal CLReven to be input to a unit circuit corresponding to an even-numbered gate line. (C) in FIG. 8 illustrates an example in which the clear signals input to the unit circuits 40 (1273) to 40 (1280) of the last eight stages are the identical clear signal CLR.

Even in the state where the stabilization circuit 18 does not normally function, such a clear signal CLRz is maintained at the L level voltage VSS during a period other than a period when the clear signal CLRz is to be the H level voltage VDD. Thus, in the unit circuits 40(*n*) included in the last eight stages, the internal node NA cannot to be brought closer to the L level voltage VSS by generating the leakage current in the transistor T3 at the same timing as the timing when the signal G(n−4) applied to the input terminal 11 affects the voltage of the internal node NA. Thus, in the unit circuits 40(*n*) included in the last eight stages, the compensation transistor T4 connected as illustrated in FIG. 6 is provided.

Figure 7:
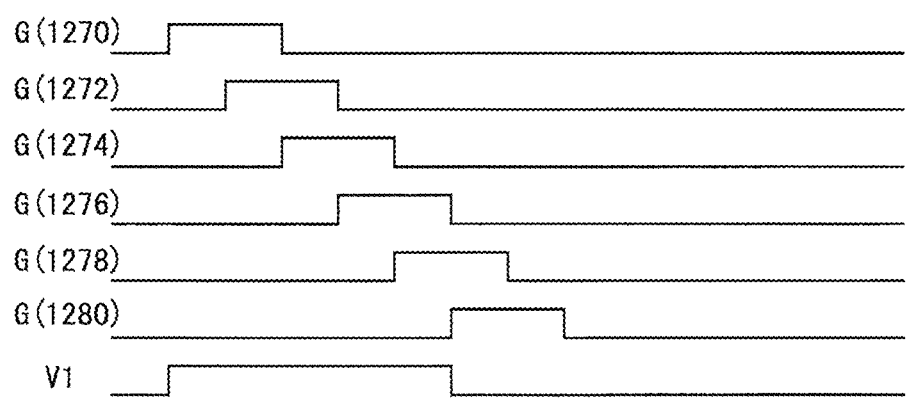
FIG. 7 is a timing chart for describing operations of unit circuits of the last eight stages in the gate driver in the first embodiment.

FIG. 7 is a timing chart for describing the operation and function of the compensation transistor T4. In FIG. 7, the number of gate lines is N=1280 for convenience of explanation, and a timing chart of scanning signals G(1270), G(1272), G(1274), . . . , G(1280) output from unit circuits 40(1270), 40(1272), 40(1274), . . . , 40(1280), respectively, of six stages adjacent to each other including the final stage of the shift register of the second gate driver 420, and of the first compensation stop signal V1 is illustrated. As illustrated in FIG. 6, the compensation transistor T4 includes the drain terminal connected to the internal node NA, the gate terminal connected to the input terminal 11, and the source terminal to which the first compensation stop signal V1 is applied. Thus, the compensation transistor T4 functions similarly to the transistor T2 during a period when the compensation stop signal V1 is at the H level. In other words, in this period, when the signal G(n−4) applied to the input terminal 11 is at the L level, the compensation transistor T4 is in the off state, and when the signal G(n−4) is at the H level, the internal node NA is charged via the compensation transistor T4 by the H level voltage (VDD) of the first compensation stop signal V1.

The first compensation stop signal V1 is a signal that is at the H level (active state) during a period when the output signal G(n−4) of the preceding stage applied to the input terminal 11 of any of the unit circuits 40(*n*) included in the last eight stages is at the H level, and that is at the L level during the other periods. In the example illustrated in FIG. 7, the number of gate lines is N=1280, and attention is focused on the second gate driver 420, and thus the first compensation stop signal V1 is at the H level during a period when any of the scanning signals G(1270), G(1272), . . . , G(1276) output from the unit circuit 40(1270), 40(1272), 40(1274), . . . , 40(1276), respectively, is at the H level, and is at the L level during the other periods. Thus, the compensation transistor T4 functions similarly to the transistor T2 during a period when the output signal G(n−4) of the preceding stage applied to the input terminal 11 of any of the unit circuits 40(*n*) included in the last eight stages is at the H level (hereinafter referred to as a "last eight stages input active period"), that is, during the period when any of the scanning signals G(1270), G(1272), . . . , G(1276) is at the H level. On the other hand, in the compensation transistor T4, during a period other than the last eight stages input active period (period when the compensation stop signal V1 is at the L level), similarly to the transistor T3 in the unit circuits 40 not included in the last eight stages, a leakage current is generated in the compensation transistor T4 at the same timing as the timing when the signal G(n−4) applied to the input terminal 11 affects the voltage of the internal node NA during a period other than a period when the H level voltage VDD is to be applied to the corresponding gate line. Thus, the voltage of the internal node NA can be brought closer to the L level voltage VSS. In this way, also in the unit circuits 40(*n*) included in the last eight stages, during a period other than the period when the H level voltage VDD is to be applied to the gate line GLn (in the output off period that is the period when the internal node NA is to be maintained at the L level), the voltage fluctuation of the internal node NA generated by the output signal G(n−4) of the preceding stage input from the input terminal 11 can be suppressed by the compensation transistor T4.

Here, regarding the compensation transistor T4 and the transistor T3 in the unit circuits 40(*n*) included in the last eight stages, when attention is focused on the voltages applied to the transistors T3 and T4 in the on state, a terminal having a lower voltage among the drain terminal and the source terminal is the drain terminal connected to the internal node NA in the transistor T4, but is the reference power supply terminal VSS in the transistor T3. Thus, the gate-source voltage Vgs as the effective voltage stress is lower in the transistor T4 than in the transistor T3, and as a result, a threshold shift due to continued use is smaller in the transistor T4 than in the transistor T3. Thus, even when the size of the transistor T4 is smaller than the size of the transistor T3, the similar effect can be obtained with respect to the suppression of the voltage fluctuation at the internal node NA.

In the above description, attention is focused on the unit circuits 40(*n*) included in the second gate driver 420 among the unit circuits 40 of the last eight stages in the gate driver, and the operation of the second gate driver 420 is described, but the operation of the first gate driver 410 can also be described in the similar manner, and the content of the operation is clear from the above description, and thus the description thereof is omitted.

1.7 Effect of First Embodiment

According to the present embodiment as described above, even in the case where the stabilization circuit 18 provided in the unit circuit 40 in the gate driver does not normally function, during a period other than a period when the H level voltage is to be applied to the gate line GLn (in the output off period that is the period when the internal node NA is to be maintained at the L level), the voltage fluctuation of the internal node NA generated by the output signal G(n−4) of the preceding stage input to the unit circuit 40 from the input terminal 11 can be suppressed by the transistor T3 including the gate terminal to which the output signal G(n+8) of the succeeding stage is applied, and even in the unit circuits 40(n) included in the last eight stages in which the output signal G(n+8) of the succeeding stage is not applied to the gate terminal of the transistor T3, the voltage fluctuation can be suppressed by the compensation transistor 14 connected as described above. This prevents malfunction due to the voltage fluctuation of the scanning signal line during a period other than a period when the H level voltage (VDD) is to be applied for selecting each gate line. According to the present embodiment, the signals applied to the gate terminals of the transistors T3 and T4 in this way in order to suppress the voltage fluctuation of the internal node NA are the output signals G(n+8) and G(n−4) of other stages disposed at relatively close positions to the own stage, and thus the increase in the frame region can be reduced.

2. Second Embodiment

Next, a display device according to a second embodiment will be described. The display device according to the present embodiment is also the active-matrix liquid crystal display device, and has the similar configuration to that of the first embodiment except for the unit circuits in the gate driver serving as the scanning signal line drive circuit (see FIGS. 1 to 3, and FIG. 5). Thus, the gate driver and the unit circuit thereof in the present embodiment will be described below.

2.1 Configuration of Unit Circuit in Second Embodiment

Figure 9:
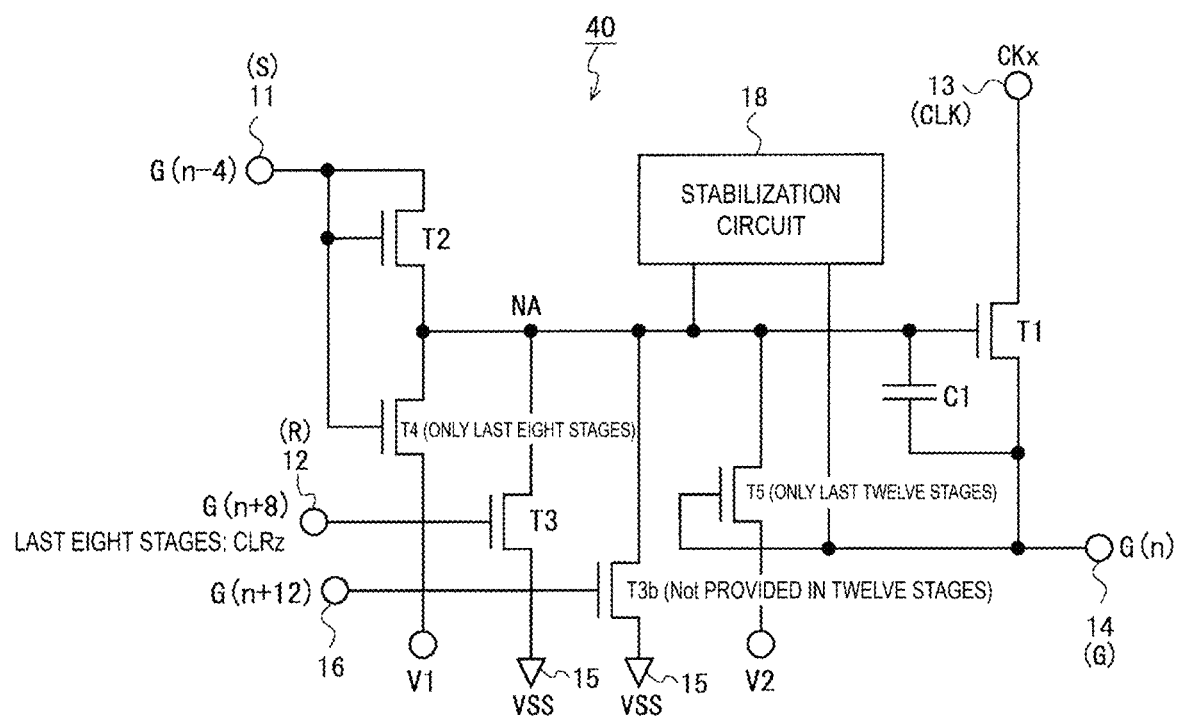
FIG. 9 is a circuit diagram illustrating a configuration of a unit circuit of a gate driver in an active-matrix display device according to a second embodiment.

FIG. 9 is a circuit diagram illustrating a configuration of the unit circuit 40 according to the present embodiment. Similarly to the unit circuit 40 (unit circuit 40 in FIG. 6) in the first embodiment, the unit circuit 40 includes the input terminal 11 serving as the set terminal S, the input terminal 12 serving as the reset terminal R, the input terminal 13 serving as the clock terminal CLK, the power supply terminal 15 serving as the reference power supply terminal VSS, and the output terminal 14 serving as the drive output terminal G, and includes the transistors T1, T2, and T3, the capacitor C1, and the stabilization circuit 18, which are connected similarly to that of the unit circuit 40 in FIG. 6. Also in the unit circuit 40 in the present embodiment, the gate terminal of the transistor T1, the source terminal of the transistor T2, and the drain terminal of the transistor T3 are connected to each other to constitute the internal node NA. As illustrated in FIG. 9, also in the unit circuit 40 of the present embodiment, each of the unit circuits 40 of the last eight stages in the gate driver is provided with the compensation transistor T4 similarly to the unit circuit 40 in FIG. 6, and the compensation transistor T4 constitutes a compensation circuit using the first compensation stop signal V1.

In addition, in the present embodiment, as illustrated in FIG. 9, a transistor T3b and an input terminal 16 are provided in each of the unit circuits 40 other than the last twelve stages in the gate driver (the transistor T3b is not provided in the unit circuits 40 of the last twelve stages). The transistor (hereinafter also referred to as a "compensation transistor") T3b includes a drain terminal connected to the internal node NA, a source terminal connected to the power supply terminal 15 serving as the reference power supply terminal VSS, and a gate terminal connected to the input terminal 16. The compensation transistor T3b connected in this manner constitutes another compensation circuit.

In the present embodiment, a transistor T5 is provided only in the unit circuits 40 in the last twelve stages in the gate driver, as illustrated in FIG. 9. The transistor (hereinafter also referred to as a "compensation transistor") T5 includes a drain terminal connected to the internal node NA, a source terminal connected to a control signal line for supplying a second compensation stop signal V2 described later, and a gate terminal connected to the output terminal 14. The compensation transistor T5 connected in this manner constitutes still another compensation circuit using the second compensation stop signal V2.

Note that in the following, the compensation transistors T4, T5, and T3b included in the unit circuits 40 are also referred to as a "first compensation transistor T4", a "second compensation transistor T5", and a "third compensation transistor T3b", respectively, as necessary.

2.2 Operation of Gate Driver in Second Embodiment

In the gate driver according to the present embodiment, the unit circuit 40 in FIG. 9 is used as the unit circuits 41u and 42u in the configuration illustrated in FIG. 3. The basic operation of this gate driver is similar to that of the first embodiment and is as already been described with reference to FIG. 5. Also in the present embodiment, similarly to the first embodiment, the first gate driver 410 applies the odd-numbered scanning signals G(1), G(3), G(5), . . . , to the odd-numbered gate lines GL1, GL3, GL5, . . . , respectively, and the second gate driver 420 applies the even-numbered scanning signals G(2), G(4), G(6), . . . , to the even-numbered gate lines GL2, GL4, GL6, . . . , respectively. In response to this, the first gate driver 410 and the second gate driver 420 differ in the gate start signal, the gate clock signal, and the like supplied thereto, but both have substantially the same configuration and operate similarly. Thus in the following, attention is focused on the unit circuit 42u(n) corresponding to the n-th gate line GLn among the unit circuits 42u in the second gate driver 420 in the gate drivers in the present embodiment, and the configuration and operation of the second gate driver 420 will be described.

In the unit circuit 40(n) included in the second gate driver 420 among the unit circuits 40 other than the last twelve stages in the gate driver, as illustrated in FIG. 9, the output signal G(n−4) of unit circuit 40(n−4) of four stages before is applied to the input terminal 11 serving as the set terminal S, and the output signal G(n+8) of the unit circuit 40(n+8) of eight stages after is applied to the input terminal 12 serving as the reset terminal R. An output signal G(n+12) of a unit circuit 40(n+12) of twelve stages after is applied to the input terminal 16 connected to the gate terminal of the third compensation transistor T3b.

In the unit circuit 40(n), when the stabilization circuit 18 does not normally function, during a period other than a period when the H level voltage (VDD) for allowing the corresponding gate line GLn to turn to the select state is to be supplied, (in the output off period that is the period when the internal node NA is to be maintained in the non-active state (L level)), the clock signal CKx applied to the drain terminal of the transistor T1 via the input terminal 13 affects the voltage of the internal node NA due to a parasitic capacitance between the gate terminal and the drain terminal in the transistor T1 and a parasitic capacitance between the gate terminal and the source terminal in the transistor T1. Specifically, the voltage of the internal node NA increases at a timing when the clock signal CKx changes from the L level (voltage VSS) to the H level (voltage VDD). In the unit circuit 40(n), the output signal G(n+12) of the succeeding stage is applied to the input terminal 16 connected to the gate terminal of the third compensation transistor T3b. Here, the same clock signal as the clock signal CKx applied to the transistor T1 via the input terminal 13 in the unit circuit 40(n) is applied to the transistor T1 of the unit circuit 40(n+12) for outputting the signal G(n+12) applied to the input terminal 16. Thus, in the unit circuit 40(n), even in a case where the stabilization circuit 18 does not normally function and the voltage of the internal node NA becomes higher than the L level voltage VSS due to the influence of the clock signal CKx applied to the input terminal 13, in the unit circuit 40(n+12) of the succeeding stage, the stabilization circuit 18 does not normally function and a leakage current is generated in the transistor T1, and thus the output signal G(n+12) becomes higher than the L level (VSS). As a result, in the unit circuit 40(n), a leakage current is generated in the third compensation transistor T3b at the same timing as the timing when the clock signal CKx affects the voltage of the internal node NA. As a result, in the unit circuit 40(n), the voltage of the internal node NA can be brought close to the L level voltage VSS, and the effect of suppressing the voltage fluctuation of the internal node NA can be obtained.

In the unit circuits 40(n) included in the second gate driver 420 among the unit circuits 40 of the last twelve stages in the gate driver, the second compensation transistor T5 is provided instead of the third compensation transistor T3b, as illustrated in FIG. 9.

Figure 10:
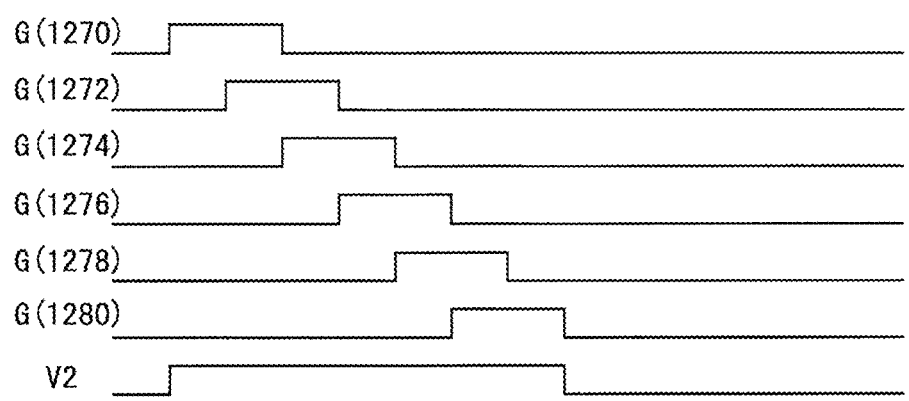
FIG. 10 is a timing chart for describing operations of unit circuits of the last eight stages in the gate driver in the second embodiment.

FIG. 10 is a timing chart for describing the operation and function of the second compensation transistor T5. In FIG. 10, the number of gate lines is N=1280 for convenience of explanation, and a timing chart of scanning signals G(1270), G(1272), G(1274), . . . , G(1280) output from unit circuits 40(1270), 40(1272), 40(1274), . . . , 40(1280), respectively, of six stages adjacent to each other including the final stage of the shift register constituting the second gate driver 420, and of the second compensation stop signal V2 are illustrated. As illustrated in FIG. 9, the second compensation transistor T5 includes a drain terminal connected to the internal node NA, a gate terminal to which the output signal G(n) of the unit circuit 40(n) is applied, and a source terminal to which the second compensation stop signal V2 is applied.

The second compensation stop signal V2 is a signal that is at the H level (active state) during a period when the output signal of any of the unit circuits 40(n) included in the last twelve stages is at the H level and that is at the L level during the other periods. In the example illustrated in FIG. 10, the number of gate lines is N=1280, and attention is focused on the second gate driver 420, and thus the second compensation stop signal V2 is at the H level during the period when any of the output signals serving as the scanning signals G(1270), G(1272), . . . , G(1280) output from the unit circuit 40(1270), 40(1272), 40(1274), . . . , 40(1280), respectively, is at the H level, and is at the L level during the other periods.

Thus, in any unit circuit 40(n) included in the last twelve stages, during the period when the output signal G(n) thereof is at the H level, the second compensation transistor T5 is in the off state, and does not affect the operation of the unit circuit 40(n). On the other hand, during a period other than the period when the output signal of any of the last twelve stages is at the H level, the second compensation stop signal V2 is at the L level, and thus, also in any unit circuit 40(n) included in the last twelve stages, the second compensation transistor T5 functions similarly to the compensation transistor T3b. In other words, even in the case where the stabilization circuit 18 does not normally function, the leakage current is generated in the second compensation transistor T5 including the gate terminal to which the output signal G(n) in the own stage is applied at the same timing as the timing when the clock signal CKx applied to the input terminal 13 affects the voltage of the internal node NA via the parasitic capacitance of the transistor T1. As a result, in the unit circuit 40(n), the voltage of the internal node NA can be brought close to the L level voltage VSS, and the effect of suppressing the voltage fluctuation of the internal node NA can be obtained.

2.3 Effect of Second Embodiment

According to the present embodiment as described above, similarly to the first embodiment, even in the case where the stabilization circuit 18 in the unit circuit 40 does not normally function in the gate driver, the voltage fluctuation of the internal node NA generated due to the output signal G(n−4) of the preceding stage input from the input terminal 11 to the unit circuit 40 is suppressed, by the function of the transistor T3 provided in the unit circuit 40 and the function of the compensation transistor 14 provided in each of the unit circuits 40 included in the last eight stages of the gate driver. In addition, according to the present embodiment, even in the case where the stabilization circuit 18 in the unit circuit 40 does not normally function in the gate driver, the voltage fluctuation of the internal node NA generated due to the clock signal CKx input from the input terminal 13 to the unit circuit 40 is suppressed, by the function of the third compensation transistor T3b provided in each of the unit circuits 40 other than the last twelve stages and the function of the second compensation transistor T5 provided in each of the unit circuits 40 included in the last twelve stages. In this manner, according to the present embodiment, in the unit circuit 40, even in the case where the stabilization circuit 18 does not normally function, when the internal node NA is to be maintained in the non-active state (L level), the voltage fluctuation generated at the internal node NA is suppressed not only by the signal G(n−4) input from the set terminal but also by the clock signal CKx input from the clock terminal CLK, and thus the output transistor T1 is maintained in the off state. This can more reliably prevent the malfunction due to increase in the voltage of the gate line during a period other than a period when the H level voltage (VDD) for selection is to be applied to the gate line.

3. Third Embodiment

Next, a display device according to a third embodiment will be described. The display device according to the present embodiment is also the active-matrix liquid crystal display device, and has basically the similar configuration to that of the first embodiment except for the unit circuits in the gate driver serving as the scanning signal line drive circuit (see FIGS. 1 to 3, and FIG. 5). Thus, the present embodiment will be described below with focusing on the gate driver and the unit circuit thereof of the present embodiment.

Figure 11:
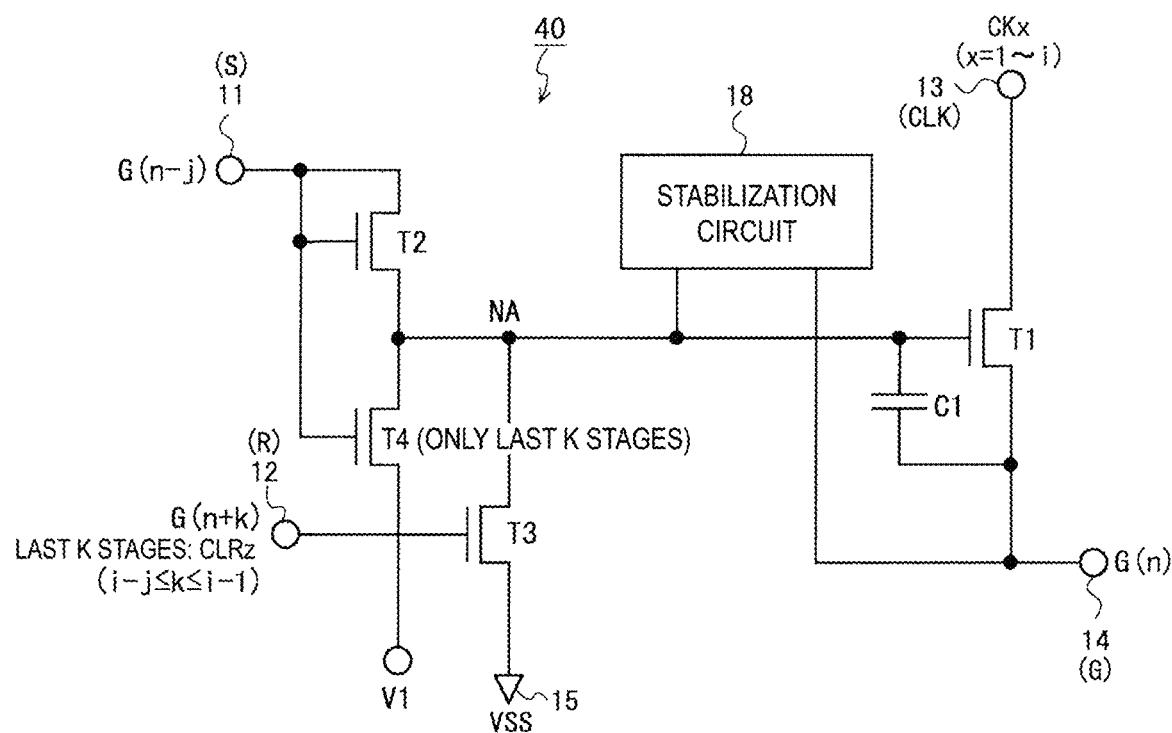
FIG. 11 is a circuit diagram illustrating a configuration of a unit circuit of a gate driver in an active-matrix display device according to a third embodiment.

FIG. 11 is a circuit diagram illustrating a configuration of the unit circuit 40 according to the present embodiment. The unit circuit 40 has the similar configuration to the unit circuit 40 in the first embodiment, that is, the unit circuit 40 illustrated in FIG. 6. In other words, the unit circuit 40 in the present embodiment includes the input terminal 11 serving as the set terminal S, the input terminal 12 serving as the reset terminal R, the input terminal 13 serving as the clock terminal CLK, the power supply terminal 15 serving as the reference power supply terminal VSS, and the output terminal 14 serving as the drive output terminal G, and includes the transistors T1, T2, T3, and T4, the capacitor C1, and the stabilization circuit 18, which are connected similarly to that of the unit circuit 40 in FIG. 6. Also in the unit circuit 40 in the present embodiment, the gate terminal of the transistor T1, the source terminal of the transistor T2, and the drain terminal of the transistor T3 are connected to each other to constitute the internal node NA. Note that although FIG. 6 illustrates the configuration of the unit circuit 40 in the second gate driver 420, and the output terminal 14 connected to the scanning signal line is disposed on the right side of the drawing, FIG. 11 illustrates the configuration of the unit circuit 40 in which the output terminal 14 connected to the scanning signal line is disposed on the right side of the drawing for convenience regardless of whether the unit circuit is included in the first gate driver 410 or the second gate driver 420 (the same applies to FIGS. 14, 16, and 20 of the embodiments described below).

In the gate driver according to the first embodiment described above, the twelve-phase clock signals are used, and in the unit circuit 40, the output signal G(n−4) of the preceding stage is applied to the input terminal 11 serving as the set terminal S, and the output signal G(n+8) of the succeeding stage or the clear signal CLRz is applied to the input terminal 12 serving as the reset terminal R, and the number of phases of the clock signal to be used and the signal input to the unit circuit 40 are specifically specified by numerical values or the like. In contrast, in the gate driver according to the present embodiment, these are specified in a generalized form. In other words, in the gate driver in the present embodiment, the number of phases of the clock signal to be used is indicated by a variable "i", and in the unit circuit 40, the output signal of the preceding stage applied to the input terminal 11 serving as the set terminal S is indicated by "G(n−j)", and the output signal of the succeeding stage applied to the input terminal 12 serving as the reset terminal R is indicated by "G(n+k)" (see FIG. 11). Note that, as described below, k is a natural number satisfying relationship (1) below.

$$i-j \le k \le i-1 \quad (1)$$

When a natural number m is defined in which a duty ratio of the clock signal to be used is m/i, j is a natural number satisfying the following relationship (2) and is normally set to j=m. Note that the duty ratio here refers to a ratio of a period when the H level is maintained to a cycle in which the H level and the L level are repeated (this duty ratio is also referred to as "on-duty").

$$1 \le j \le i-m \quad (2)$$

The gate driver and the unit circuit thereof in the present embodiment will be described below using the natural numbers i, j, and k as described above.

In the first embodiment described above, the compensation transistor T4 is provided only in each of the unit circuits 40 in the last eight stages among the unit circuits 40 constituting the gate driver, as illustrated in FIG. 6. In contrast, in the present embodiment, the first compensation transistor T4 is provided only in each of the unit circuits 40 in the last k stages among the unit circuits 40 constituting the gate driver, as illustrated in FIG. 11. The connection form of the first compensation transistor T4 in the unit circuit 40 is similar to the connection form of the first compensation transistor T4 in the unit circuit 40 in FIG. 6.

Figure 12:
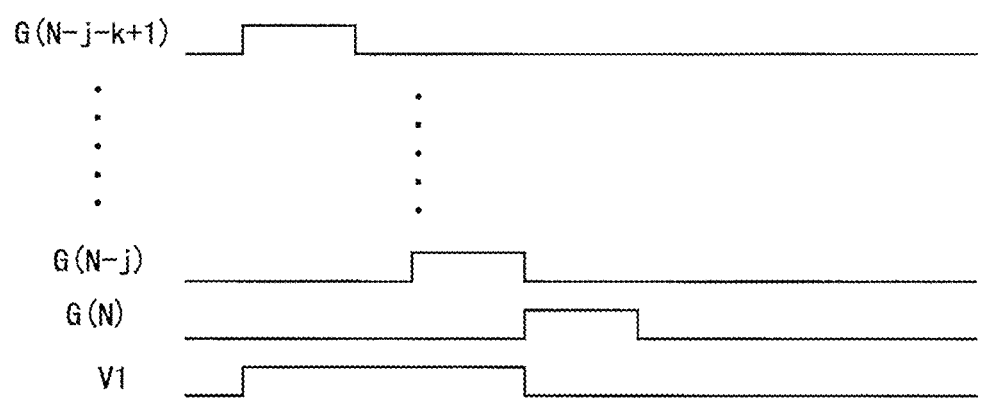
FIG. 12 is a timing chart for describing operations of unit circuits of the last k stages in the gate driver in the third embodiment.

FIG. 12 is a timing chart for describing the operation and function of the compensation transistor T4 in the present embodiment. As illustrated in FIG. 11, similarly to the first embodiment (see FIG. 6), the compensation transistor T4 includes a drain terminal connected to the internal node NA, a gate terminal connected to the input terminal 11 serving as the set terminal S, and a source terminal to which the first compensation stop signal V1 is applied.

The number of gate lines in the present embodiment is N (see FIG. 1), and in FIG. 12, G(N) indicates the output signal of the unit circuit 40(N) of the final stage in the gate driver, and G(N−j) indicates the output signal of the preceding stage applied to the set terminal S (input terminal 11) of the unit circuit 40(N) of the final stage. G(N−j−k+1) indicates the output signal of the preceding stage applied to the set terminal S (input terminal 11) of the unit circuit (N−k+1) of a head stage (the stage closest to the first stage) in the last k stages described above. As can be seen from FIG. 12, the first compensation stop signal V1 is a signal that is at the H level during a period when the output signal G(n−k) of the preceding stage applied to the input terminal 11 of any of the unit circuits 40(n) included in the last k stages is at the H level (hereinafter referred to as the "last k stages input active period"), and that is at the L level during the other periods.

Thus, the first compensation transistor T4 functions similarly to the transistor T2 during the last k stages input active period (during the period when the first compensation stop signal V1 is at the H level). In contrast, the first compensation transistor T4 functions similarly to the transistor T3 in the unit circuit 40 in the first embodiment during a period other than the last k stages input active period (during a period when the first compensation stop signal V1 is at the L level). In other words, in the case where the stabilization circuit 18 does not normally function, in any unit circuit 40(n) included in the last k stages, during a period other than the period when the H level voltage VDD to be applied to the corresponding gate line (output off period that is the period when the internal node NA is to be maintained at the L level), the voltage of the internal node NA can be brought closer to the L level voltage VSS by generating the leakage current in the first compensation transistor T4 at the same timing as the timing when the signal G(n−j) applied to the input terminal 11 affects the voltage of the internal node NA. In this way, the voltage fluctuation of the internal node NA generated by the output signal G(n−j) of the preceding stage input from the input terminal 11 can be suppressed by the first compensation transistor T4.

Figure 13:
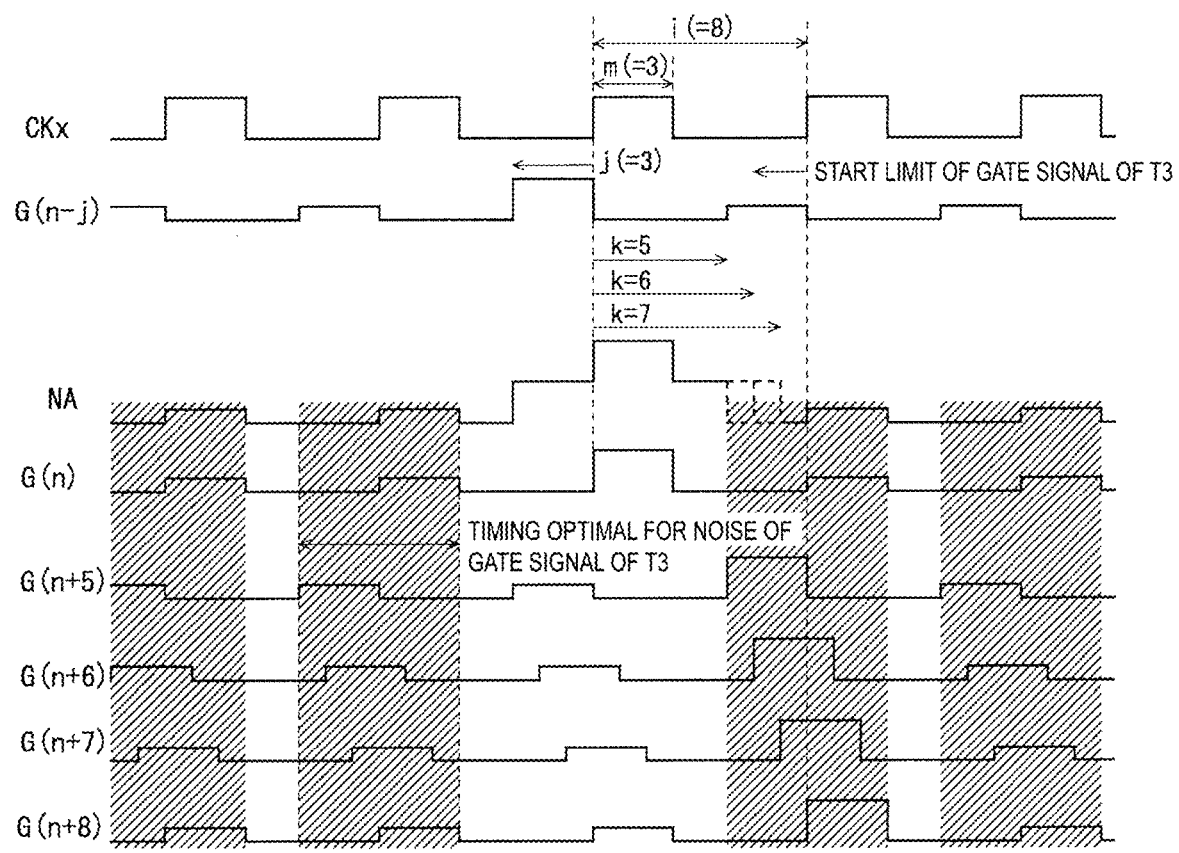
FIG. 13 is a signal waveform diagram for describing operations of the gate driver in the third embodiment.

FIG. 13 is a signal waveform diagram for describing the operation of the gate driver in the present embodiment, and illustrates a waveform of a signal associated with drive of the unit circuit 40(n) (see FIG. 11) included in the last k stages in a case where eight-phase clock signals whose on-duty is set to 3/8 are used (i=8, m=3), and j=3. As can be seen from the description of the first and second embodiments, when the stabilization circuit 18 does not normally function, the voltage of the internal node NA of the unit circuit 40(n) is affected by the output signal G(n−j) of the preceding stage via the transistor T2 and is affected by the input clock signal CKx via the transistor T1 and the capacitor C1. In FIG. 13, periods during which the voltage of the internal node NA is affected by the signals G(n−j) and CKx are indicated as hatched regions.

Thus, when a leakage current is generated in the transistor T3 during the periods indicated by the hatched regions (hereinafter referred to as "voltage fluctuation compensation effective periods"), the voltage fluctuation of internal node NA generated due to the signals G(n−j) and CKx can be suppressed. The selection range of k for allowing the leakage current to be generated in the transistor T3 during the periods by the output signal G(n+k) of the succeeding stage applied to the gate terminal of the transistor T3 is i−j≤k≤i according to FIG. 13. However, in order to prevent malfunction in the unit circuit 40(n), it is necessary to end an operation of discharging the voltage of the internal node NA toward the L level (VSS) via the transistor T3 before the input clock signal CKx changes to the H level for the first time after the end of a period at which the output signal G(n) of the unit circuit 40(n) is at the H level. Thus, k=i cannot be selected. Thus, the selection range of k in the present embodiment is i−j≤k≤i−1 as illustrated in the relationship (1) (8−3≤k≤7 in the example illustrated in FIG. 13). Thus, in the unit circuits 40(n) other than the last k stages, the gate driver of the present embodiment is configured such that the output signal G(n+k) of the succeeding stage specified by the natural number k satisfying the relationship (1) is applied to the gate terminal of the transistor T3 via the input terminal 12 (see FIG. 11). Note that in the example illustrated in FIG. 13, the selectable value of k is any of 5, 6, and 7.

In any of the unit circuits 40(n) of the last k stages described above, the charging of the internal node NA via the first compensation transistor T4 is performed at the same timing as the timing of the charging of the internal node NA via the transistor T2, and thus the selection range of the signal applied to the gate terminal of the first compensation transistor T4 cannot be wider than that of the first embodiment. However, it is possible to adjust a channel width of the first compensation transistor T4 so that the suppression effect on the voltage fluctuation of the internal node NA by the first compensation transistor T4 is sufficiently enhanced.

According to the present embodiment as described above, the natural numbers i, j, and k can be selected within the predetermined range described above, and thus the similar effect to that of the above-described first embodiment can be obtained in a wider range of configurations including the configuration of the gate driver and the unit circuit 40 thereof in the first embodiment. Note that, according to the selection of the natural number i, j, and k described above, the connection between the unit circuits 40 in the gate driver slightly changes. However, since the basic configuration of the gate driver is similar to the configuration illustrated in FIG. 3, the specific configuration of the gate driver corresponding to the selected natural numbers i, j, and k can be easily grasped from the configuration illustrated in FIG. 3 (the same applies to the embodiments and modifications thereof described later). According to the present embodiment, the signals input for suppressing the voltage fluctuation of the internal node NA in each unit circuit 40 are the output signals G(n−j) and G(n+k) of other stages disposed at relatively close positions to the own stage, and thus the increase in the frame region can be reduced.

4. Fourth Embodiment

Next, a display device according to a fourth embodiment will be described. The display device according to the present embodiment is also the active-matrix liquid crystal display device, and has basically the similar configuration to that of the first embodiment except for the unit circuits in the gate driver serving as the scanning signal line drive circuit (see FIGS. 1 to 3, and FIG. 5). Thus, the present embodiment will be described below with focusing on the gate driver and the unit circuit thereof of the present embodiment.

Figure 14:
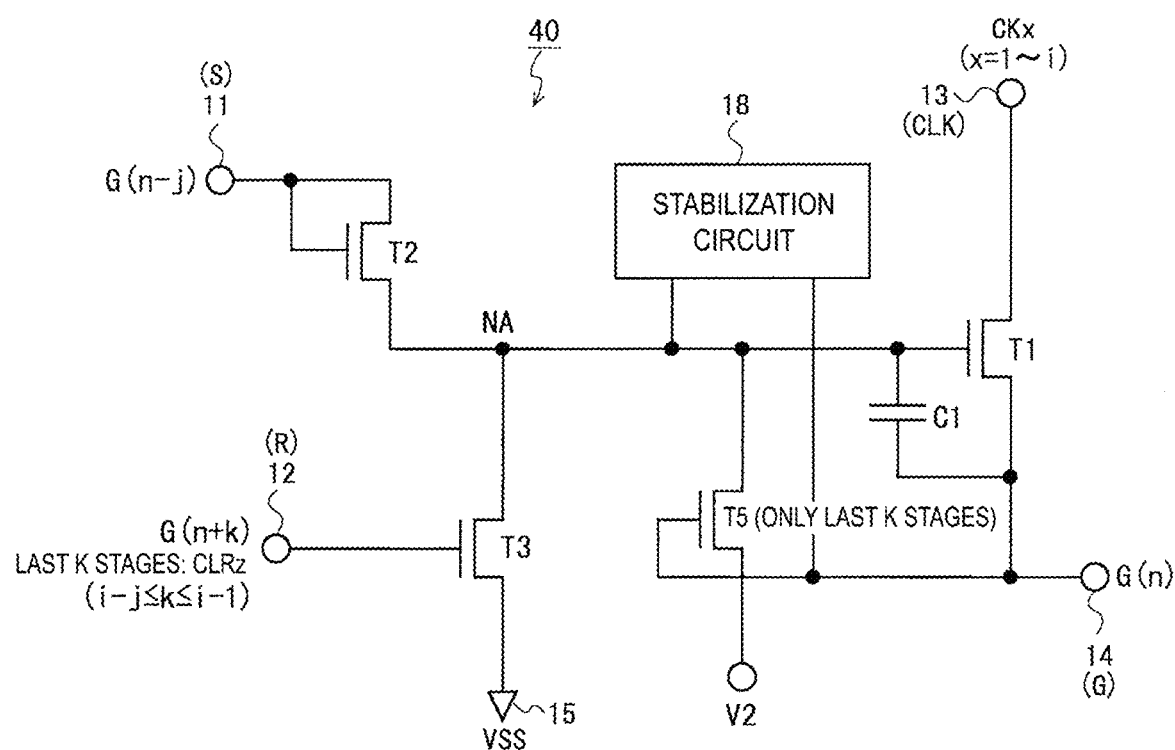
FIG. 14 is a circuit diagram illustrating a configuration of a unit circuit of a gate driver in an active-matrix display device according to a fourth embodiment.

FIG. 14 is a circuit diagram illustrating a configuration of the unit circuit 40 according to the present embodiment. The unit circuit 40 has a configuration in which the first compensation transistor T4 is deleted and the second compensation transistor T5 is added in the unit circuit 40 of the third embodiment, that is, the unit circuit 40 in FIG. 11. Note that, the second compensation transistor T5 is provided only in the unit circuits 40 in the last k stages in the gate driver.

Figure 15:
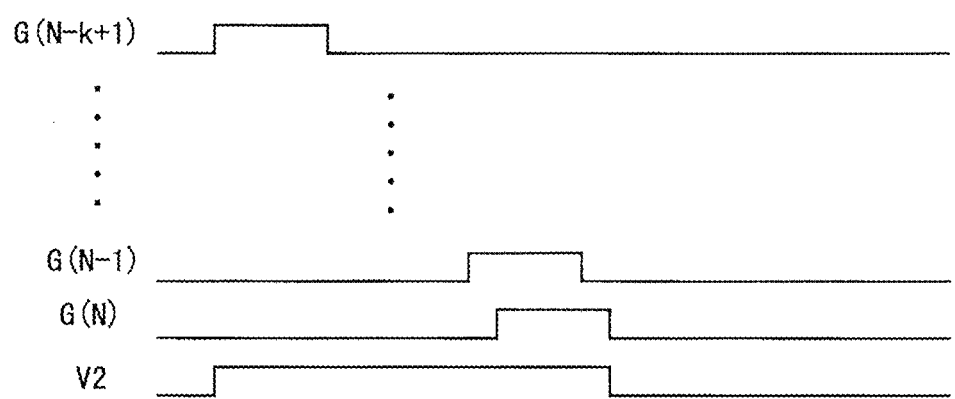
FIG. 15 is a timing chart for describing operations of unit circuits of the last k stages in the gate driver in the fourth embodiment.

FIG. 15 is a timing chart for describing the operation and function of the second compensation transistor T5 in the present embodiment. As illustrated in FIG. 14, the second compensation transistor T5 includes a drain terminal connected to the internal node NA, a gate terminal connected to the input terminal 11 serving as the set terminal S, and a source terminal to which the second compensation stop signal V2 is applied.

The number of gate lines in the present embodiment is N, and in FIG. 15, G(N) indicates the output signal of the unit circuit 40(N) in the final stage in the gate driver, G(N−1) indicates the output signal of the unit circuit 40(N) in the previous stage of the final stage, and G(N−k+1) indicates the output signal of the unit circuit (N−k+1) of the head stage (the stage closest to the first stage) in the last k stages described above. As can be seen from FIG. 15, the second compensation stop signal V2 is a signal that is at the H level during a period when the output signal G(n) of any of the unit circuits 40(n) included in the last k stages is at the H level (hereinafter referred to as a "last k stages output active period"), and that is at the L level during the other periods.

Thus, also in any unit circuit 40(n) included in the last k stages, during the period when the output signal G(n) thereof is at the H level, the second compensation transistor T5 is in the off state and does not affect the operation of the unit circuit 40(n). On the other hand, during a period other than the period when the output signal of any of the last k stages is at the H level, the second compensation stop signal V2 is at the L level, and thus, in the case where the stabilization circuit 18 does not normally function, in any unit circuit 40(n) included in the last k stages, the leakage current is generated in the transistor T5 including the gate terminal to which the output signal G(n) in the own stage is applied, at the same timing as the timing when the clock signal CKx applied to the input terminal 13 affects the voltage of the internal node NA via the parasitic capacitance of the transistor T1. As a result, in the unit circuit 40(n), the voltage of the internal node NA can be brought closer to the L level voltage VSS, and the effect of suppressing the voltage fluctuation of the internal node NA can be obtained.

According to the present embodiment as described above, similarly to the third embodiment, the natural numbers i, j, and k can be selected within the predetermined range described above, and thus as compared with the case where the natural numbers i, j, and k are specified by the specific numerical values (the first and second embodiments), a wider range of configurations is possible, and the selection range of the signals applied to the gate terminal of the transistor T3 is wider. Note that, although the selection range of the signal applied to the gate terminal of the second compensation transistor T5 cannot be made wider, it is possible to adjust a channel width of the second compensation transistor T5 so that the suppression effect on the voltage fluctuation of the internal node NA by the second compensation transistor T5 is sufficiently enhanced. Also in the present embodiment, the signals input for suppressing the voltage fluctuation of the internal node NA in each unit circuit 40 are the output signals G(n−j) and G(n+k) of other stages disposed at relatively close positions to the own stage, and thus the increase in the frame region can be reduced.

5. Fifth Embodiment

Next, a display device according to a fifth embodiment will be described. The display device according to the present embodiment is also the active-matrix liquid crystal display device, and has basically the similar configuration to that of the first embodiment except for the unit circuits in the gate driver serving as the scanning signal line drive circuit (see FIGS. 1 to 3, and FIG. 5). Thus, the present embodiment will be described below with focusing on the gate driver and the unit circuit thereof of the present embodiment.

Figure 16:
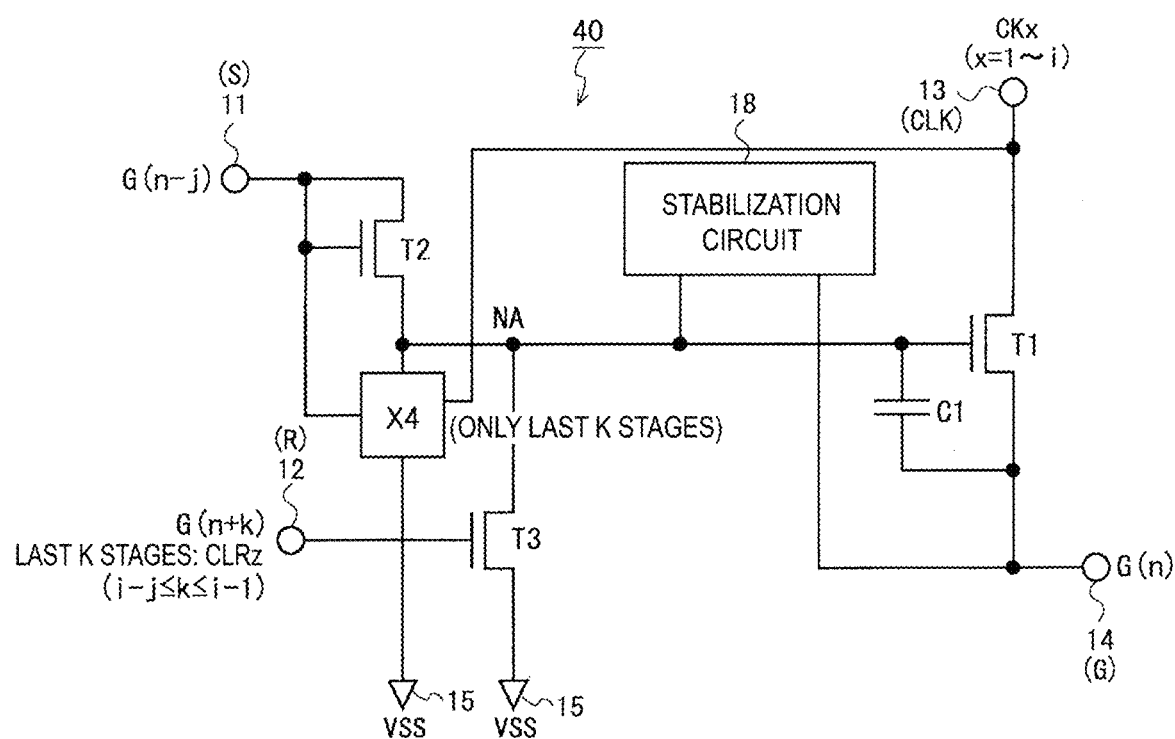
FIG. 16 is a circuit diagram illustrating a configuration of a unit circuit of a gate driver in an active-matrix display device according to a fifth embodiment.

FIG. 16 is a circuit diagram illustrating a configuration of the unit circuit 40 according to the present embodiment. In the unit circuit 40 of the third embodiment, that is, the unit circuit 40 illustrated in FIG. 11, this unit circuit 40 is obtained by replacing the compensation circuit including the first compensation transistor T4 including the source terminal to which the first compensation stop signal V1 (see FIG. 12) is applied with a compensation circuit X4 having a different configuration. Similarly to the compensation transistor T4, the compensation circuit X4 is provided only in the unit circuits 40 of the last k stages in the gate driver.

5.1 Compensation Circuit According to First Configuration Example

Figure 17:
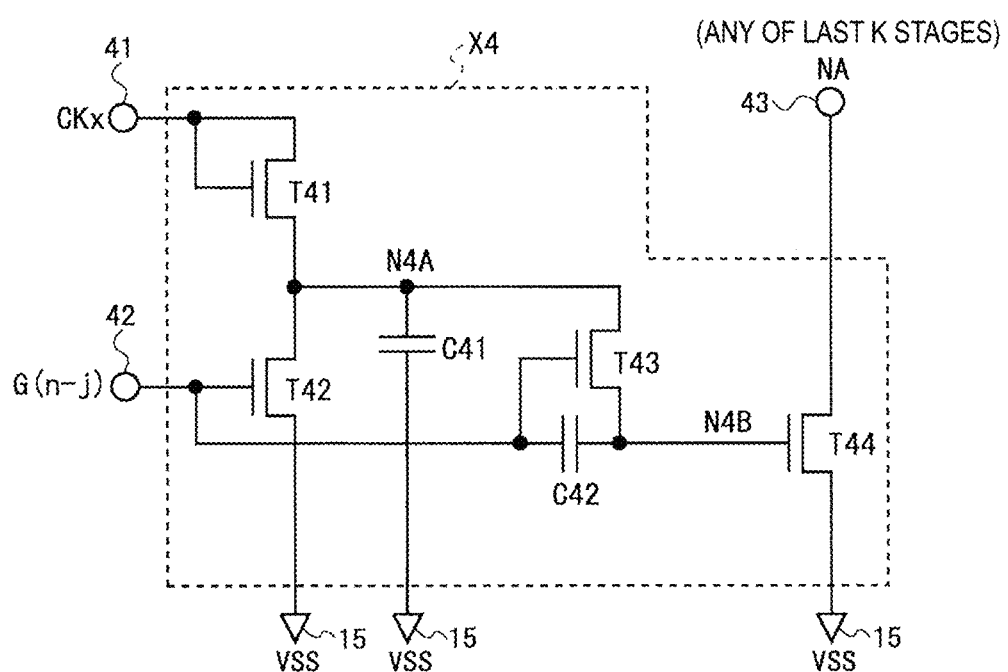
FIG. 17 is a circuit diagram illustrating a first configuration example of a compensation circuit included in the unit circuit of the gate driver in the fifth embodiment.

FIG. 17 is a circuit diagram illustrating a first configuration example of the compensation circuit X4. As illustrated in FIG. 17, the compensation circuit X4 according to the first configuration example includes an input terminal 41 connected to the clock terminal CLK (input terminal 13), an input terminal 42 connected to the set terminal S (input terminal 11), an output terminal 43 connected to the internal node NA, and the reference power supply terminal VSS (the power supply terminal 15), and includes transistors T41, T42, T43, and T44, and capacitors C41 and C42. In this compensation circuit X4, a source terminal of the transistor T41, a drain terminal of the transistor T42, and a drain terminal of the transistor T43 are connected to each other to constitute the internal node N4A serving as a compensation internal node, and a source terminal of the transistor T43 and a gate terminal of the transistor 144 are connected to each other to constitute an internal node N4B. (Note that in the following, when the internal nodes NA, N4A, and N4B are distinguished from each other by their names, they are referred to as a "first internal node NA", a "second internal node N4A", and a "third internal node N4B", respectively.)

As illustrated in FIG. 17, the transistor T41 includes the drain terminal and a gate terminal connected to the input terminal 41, the transistor T42 includes a gate terminal connected to the input terminal 42 and a source terminal connected to the power supply terminal 15, the transistor T43 includes a gate terminal connected to the input terminal 42, and the transistor T44 includes a drain terminal connected to the output terminal 43 and a source terminal connected to the power supply terminal 15. The internal node N4A is connected to the power supply terminal 15 via the capacitor C41, and the gate terminal and the source terminal of the transistor T43 are connected to each other via the capacitor C42. The capacitor C42 includes a first terminal and a second terminal which are thus connected to the gate terminal and the source terminal of the transistor T43, respectively, and thus functions to control the compensation operation by the compensation transistor 144 as described below.

In the compensation circuit X4 configured as described above, when the clock signal (input clock signal) CKx applied to the clock terminal CLK (input terminals 13 and 41) is changed to the H level before the output signal G(n–j) of the preceding stage applied to the set terminal S (input terminals 11 and 42) turns to the H level, the second internal node N4A and the capacitor C41 are charged to the H level via the transistor T41. Note that at this time, the transistor T43 is in the off state, and the third internal node N4B is in a floating state.

Thereafter, when the signal G(n–j) applied to the set terminal S changes from the L level to the H level, the voltage of the second internal node N4A is discharged via the transistor T42 to turn to the L level (voltage VSS). At this time, the voltage of the third internal node N4B temporarily increases due to the function of the capacitor C42, but immediately turns to the L level (voltage VSS) by the transistors T42 and T43 turning to the on state. As a result, while the signal G(n–j) is at the H level, the voltage VDD-VSS corresponding to the difference between the H level and the L level is held in the capacitor C42. Note that when the third internal node N4B is at the L level, the transistor 144 is in the off state.

Thereafter, when the signal G(n–j) applied to the set terminal S changes from the H level to the L level, the transistor T42 turns to the off state, and the voltage of the third internal node N4B temporarily turns to a voltage lower than the L level voltage VSS by the holding voltage of the capacitor C42. However, since the holding voltage of the capacitor C42, which is the gate-source voltage of the transistor T43 at this time, is larger than a threshold voltage Vth(T43) of the transistor 143, a current flows from the second internal node N4A to the third internal node N4B via the transistor T43 and the voltage of the third internal node N4B increases. As a result, the holding voltage of the capacitor C42, which is the gate-source voltage of the transistor T43, decreases, and when the transistor T43 turns to the off state, the decrease of the holding voltage of the capacitor C42 stops. At this point, a voltage ΔV, which is approximately equal to the threshold voltage Vth(T43) of the transistor T43, is held in the capacitor C42, and then the voltage of the third internal node N4B is maintained at a value corresponding to this voltage. Note that the transistor T43 is the N-channel type, and thus ΔV≈Vth(T43)>0.

Thereafter, during a period other than a period when the signal G(n–j) applied to the set terminal S is to be set to the H level voltage VDD, while a condition is satisfied in which the voltage of the signal G(n–j) is not higher than the voltage of the second internal node N4A by the threshold voltage Vth(T43) of the transistor T43 or more, the transistor T43 is maintained in the off state and the third internal node N4B is in the floating state. In the configuration illustrated in FIG. 17, since the input terminal 41 for receiving the clock signal CKx is connected to the second internal node N4A via the transistor T41 in the diode connection form, the second internal node N4A is charged to the H level each time the clock signal CKx changes to the H level. When the second internal node N4A turns to the H level in this manner, even when the voltage of the signal G(n–j) is somewhat fluctuated due to noise or the like during the period when the signal G(n–j) is to be set to the L level, the above-described condition is satisfied, and thus the transistor T43 is maintained in the off state and the third internal node N4B turns to the floating state. Thus, the voltage of the third internal node N4B follows the voltage change of the signal G(n–j) while maintaining a relationship that the voltage of the third internal node N4B is lower than the voltage of the signal G(n–j) by the holding voltage ΔV (≈Vth(T43)) of the capacitor C42. The transistor 141 in the diode connection form described above constitutes a compensation auxiliary circuit for ensuring an operation of such a compensation circuit X4.

With the above-described operation of the compensation circuit X4 according to the first configuration example illustrated in FIG. 17, the transistor 144 functions as a compensation transistor for suppressing the voltage fluctuation at the first internal node NA, and the transistor T43 and the capacitor C42 control the compensation operation by the compensation transistor 144. In other words, during the period when the signal G(n−j) applied to the set terminal S is to be set to the H level (voltage VDD), the transistor 144 is maintained in the off state by setting the third internal node N4B to the L level (voltage VSS). On the other hand, during the period when the signal G(n−j) applied to the set terminal S to be set to the L level (voltage VSS), when the stabilization circuit 18 does not normally function and the signal G(n−j) changes, the voltage of the third internal node N4B follows the voltage change of the signal G(n−j) while maintaining the relationship that the voltage of the third internal node N4B is lower than the voltage of the signal G(n−j) by the holding voltage ΔV (≈Vth(T43)) of the capacitor C42. Thus, in a case where the voltage of the signal G(n−j) is fluctuated to increase the voltage of the first internal node NA when the signal G(n−j) applied to the set terminal S is to be set to the L level, the voltage of the third internal node N4B of the compensation circuit X4 changes in accordance with the voltage fluctuation of the signal G(n−j), and the leakage current is generated in the transistor 144. As a result, the increase of the voltage of the first internal node NA is suppressed, and the voltage is brought closer to the L level voltage VSS. Note that, it is assumed that the threshold voltage Vth(T43) of the transistor T43 is sufficiently smaller than the voltage fluctuation of the signal G(n−j).

In this way, the compensation circuit X4 (FIG. 17) according to the first configuration example functions similarly to the compensation circuit provided in the unit circuit 40 in the first to third embodiments, that is, the compensation circuit including the first compensation transistor 14 including the source terminal to which the first compensation stop signal V1 is applied (see FIGS. 6, 9, and 11).

5.2 Compensation Circuit According to Second Configuration Example

Figure 18:
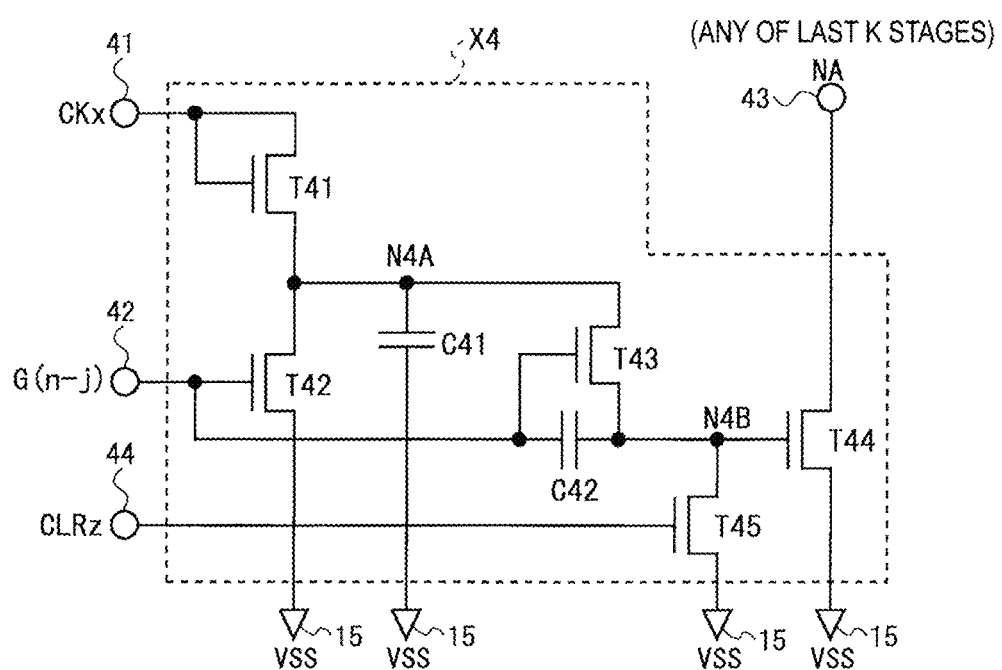
FIG. 18 is a circuit diagram illustrating a second configuration example of a compensation circuit included in the unit circuit of the gate driver in the fifth embodiment.

FIG. 18 is a circuit diagram illustrating a second configuration example of the compensation circuit X4 (FIG. 16) provided only in the unit circuits 40 of the last k stages of the gate driver among the unit circuits 40 in the present embodiment. As illustrated in FIG. 18, the compensation circuit X4 according to the second configuration example has a configuration in which an input terminal 44 to which the above-mentioned clear signal CLRz is applied and a transistor T45 are added to the unit circuit 40 (FIG. 17) according to the first configuration example. In the other configurations of the compensation circuit X4 according to the second configuration example, the same parts are denoted by the same reference numerals, and detailed description thereof is omitted. Note that, as will be described below, when the transistor T42 serving as a compensation setting transistor sets the compensation circuit X4 to a state in which the fluctuation of the first internal node NA can be appropriately compensated, the transistor T45 serves to assist the setting (hereinafter, the transistor T45 is also referred to as a "compensation setting auxiliary transistor").

In the compensation circuit X4 according to the second configuration example illustrated in FIG. 18, the added transistor T45 includes a drain terminal connected to the third internal node N4B, a source terminal connected to the power supply terminal 15 (reference power supply terminal VSS), and a gate terminal connected to the added input terminal 44.

Figure 19:
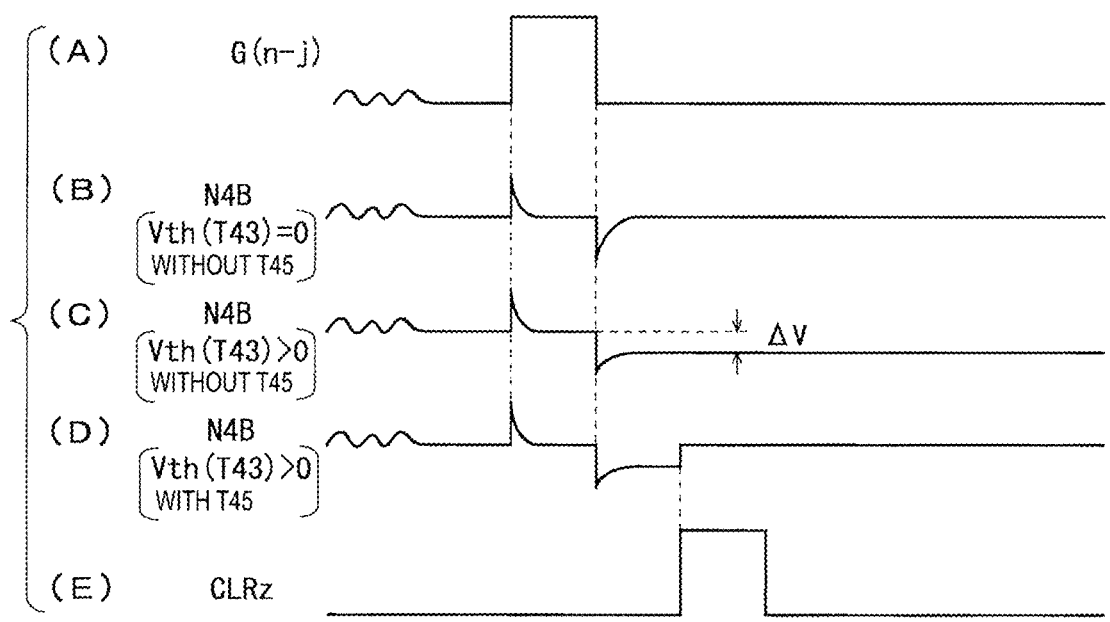
FIG. 19 is a voltage waveform diagram for describing an operation of a compensation circuit included in the unit circuit of the gate driver in the fifth embodiment.

FIG. 19 is a voltage waveform diagram for describing an operation of the compensation circuit X4 (FIG. 18) according to the second configuration example. Referring now to FIG. 19, the operation of the compensation circuit X4 (FIG. 18) according to the second configuration example will be described below in comparison with the operation of the compensation circuit X4 (FIG. 17) according to the first configuration example.

When the output signal G(n−j) of the preceding stage applied to the set terminal S (input terminals 11 and 42) changes from the L level to the H level, similarly to the first configuration example (see (B) and (C) in FIG. 19), the voltage of the second internal node N4A is discharged via the transistor T42 to turn to the L level (voltage VSS), and the voltage of the third internal node N4B temporarily increases due to the function of the capacitor C42. However, as illustrated in (D) of FIG. 19, after the increase, the voltage of the third internal node N4B immediately turns to the L level (voltage VSS) by the transistors 142 and T43 turning to the on state. As a result, while the signal G(n−j) is at the H level, the voltage VDD-VSS corresponding to the difference between the H level and the L level is held in the capacitor C42.

Thereafter, also when the signal G(n−j) applied to the set terminal S changes from the H level to the L level, the voltage of the third internal node N4B changes similarly to the first configuration example (see (B) and (C) in FIG. 19) as illustrated in (D) of FIG. 19. In other words, the transistor T42 turns to the off state by the change of the signal G(n−j) from the H level to the L level, and the voltage of the third internal node N4B temporarily turns to the voltage lower than the L level voltage VSS by the holding voltage of the capacitor C42, but a current flows from the second internal node N4A to the third internal node N4B via the transistor T43 in the on state, and the voltage of the third internal node N4B increases. As a result, the holding voltage of the capacitor C42, which is the gate-source voltage of the transistor T43, decreases, and when the transistor T43 turns to the off state, the decrease of the holding voltage of the capacitor C42 stops. At this point, the voltage ΔV, which is approximately equal to the threshold voltage Vth(T43) of the transistor T43, is held in the capacitor C42.

Here, when the threshold voltage Vth(T43) of the transistor T43 is zero, thereafter while the transistor T43 is in the off state, the voltage of the third internal node N4B is equal to the signal G(n−j) applied to the set terminal S, as illustrated in (B) of FIG. 19. As a result, the compensation circuit X4 (FIG. 17) according to the first configuration example functions similarly to the compensation circuit provided in the unit circuit 40 in the first to third embodiments, that is, the compensation circuit including the compensation transistor T4 including the source terminal to which the first compensation stop signal V1 is applied (see FIGS. 6, 9, and 11).

However, in a case where the threshold voltage Vth(T43) of the transistor T43 has a value that is not negligible as compared with the voltage fluctuation of the signal G(n−j) when the signal G(n−j) applied to the set terminal S is to be set to the L level, the compensation circuit X4 may not function similarly to the compensation circuit (see FIG. 6 and the like) including the compensation transistor T4 including the drain terminal to which the first compensation stop signal V1 is applied.

In other words, after the signal G(n−j) applied to the set terminal S changes from the H level to the L level, while the transistor T43 is in the off state, the voltage of the third internal node N4B is a voltage that is lower than the signal G(n−j) applied to the set terminal S by the holding voltage ΔV (≈Vth(T43)) of the capacitor C42, as illustrated in (C) of FIG. 19. In such a state, when a next frame period is started in the display device 100 according to the present embodiment, even when the voltage of the signal G(n−j) fluctuates to be higher than the L level voltage VSS during the period when the signal G(n−j) is to be set to the L level, the transistor 144 may be maintained in the off state. In this case, in the compensation circuit X4 (FIG. 17) according to the first configuration example, the effect of suppressing the voltage increase of the node NA due to the voltage fluctuation of the signal G(n−j) by the leakage current of the transistor 144 is not obtained.

On the other hand, in the compensation circuit X4 according to the second configuration example, as illustrated in FIG. 18, the third internal node N4B is connected to the reference power supply terminal VSS (power supply terminal 15) via the transistor T45, and the above-mentioned clear signal CLRz is applied to the gate terminal of the transistor T45. The clear signal CLRz is a signal which turns to the H level only for a predetermined period after the output signal G(n) of the unit circuit 42u(n) of the own state changes to the L level (see (A) to (C) in FIG. 8). Thus, as illustrated in (D) of FIG. 19, the third internal node N4B turns to the low-voltage power supply voltage VSS of the L level at the time when the clear signal CLRz changes to the H level, and the third internal node N4B is also at the L level after the clear signal CLRz changes from the H level to the L level. However, during a period other than the period when the signal G(n−j) applied to the set terminal S is to be set to the H level voltage VDD among the period when the clear signal CLRz is at the L level, while a condition is satisfied in which the voltage of the signal G(n−j) is not higher than the voltage of the second internal node N4A by the threshold voltage Vth(T43) of the transistor T43 or more, the transistor T43 is maintained in the off state and the third internal node N4B is in the floating state. In the configuration illustrated in FIG. 18, since the input terminal 41 for receiving the clock signal CKx is connected to the second internal node N4A via the transistor 141 in the diode connection form, the second internal node N4A is charged to the H level each time the clock signal CKx changes to the H level. When the second internal node N4A turns to the H level in this manner, even when the voltage of the signal G(n−j) is somewhat fluctuated due to noise or the like during the period when the signal G(n−j) is to be set to the L level, the above-described condition is satisfied, and thus the transistor T43 is maintained in the off state and the third internal node N4B is in the floating state. Thus, due to the function of the capacitor C42, in the next frame period in the display device 100 according to the present embodiment, the voltage of the third internal node N4B has the same value as the voltage of the signal G(n−j) applied to the set terminal S, and follows the voltage fluctuation of the signal G(n−j). The transistor 141 in the diode connection form described above constitutes a compensation auxiliary circuit for ensuring an operation of such a compensation circuit X4.

Thus, according to the compensation circuit X4 according to the second configuration example, in a case where the voltage of the signal G(n−j) is fluctuated to increase the voltage of the first internal node NA when the signal G(n−j) applied to the set terminal S is to be set to the L level, the voltage of the third internal node N4B of the compensation circuit X4 changes in accordance with the voltage fluctuation of the signal G(n−j) regardless of the threshold voltage Vth(T43) of the transistor T43, and the leakage current is generated in the transistor 144. As a result, the voltage increase of the first internal node NA is suppressed and the first internal node NA is brought closer to the L level voltage VSS.

5.3 Effect of Fifth Embodiment

According to the present embodiment as described above, the compensation circuit X4 illustrated in FIG. 17 or 18 is used in place of the compensation circuit including the first compensation transistor T4 including the source terminal to which the first compensation stop signal V1 (see FIG. 12) is applied, and thus even in the case where the stabilization circuit 18 provided in the unit circuit 40 in the gate driver does not normally function, during the period other than the period when the H level voltage is to be applied to the gate line GLn (in the output off period that is the period when the first internal node NA is to be maintained at the L level), the voltage fluctuation of the first internal node NA generated due to the signal G(n−j) applied to the set terminal S is suppressed, and the malfunction of the gate driver can be prevented. As described above, according to the present embodiment, the similar effect to that of the third embodiment can be obtained without using the first compensation stop signal V1.

Note that, according to the present embodiment, the compensation circuit X4 (FIGS. 17 and 18) is used in place of the compensation circuit including the first compensation transistor 14 including the source terminal to which the first compensation stop signal V1 is applied, and thus the area of each of the unit circuit 40 included in the last k stages is increased as compared with the unit circuit 40 (FIG. 11) in the third embodiment. However, since each unit circuit 40 in the present embodiment does not use the output signal of the unit circuit 40 far from the own stage, there is less restriction on the circuit arrangement, and the malfunction due to the voltage fluctuation of the internal node can be prevented while suppressing the increase in the frame region in the GDM panel, as compared with the related art.

6. Sixth Embodiment

Next, a display device according to a sixth embodiment will be described. The display device according to the present embodiment is also the active-matrix liquid crystal display device, and has basically the similar configuration to that of the first embodiment except for the unit circuits in the gate driver serving as the scanning signal line drive circuit (see FIGS. 1 to 3, and FIG. 5). Thus, the present embodiment will be described below with focusing on the gate driver and the unit circuit thereof of the present embodiment.

Figure 20:
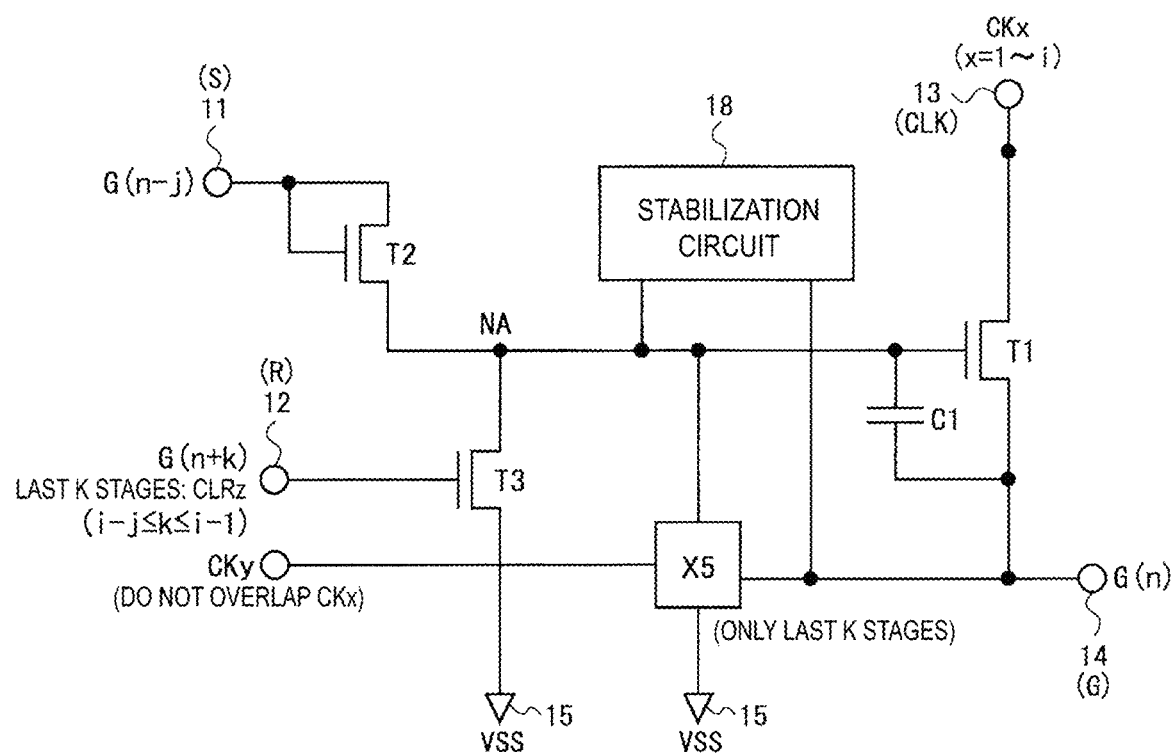
FIG. 20 is a circuit diagram illustrating a configuration of a unit circuit of a gate driver in an active-matrix display device according to a sixth embodiment.

FIG. 20 is a circuit diagram illustrating a configuration of the unit circuit 40 according to the present embodiment. In the unit circuit 40 of the fourth embodiment, that is, the unit circuit 40 illustrated in FIG. 14, this unit circuit 40 is obtained by replacing the compensation circuit including the second compensation transistor T5 including the source terminal to which the second compensation stop signal V2 (see FIG. 15) is applied with a compensation circuit X5 having a different configuration. Similarly to the second compensation transistor T5, the compensation circuit X5 is provided only in the unit circuits 40 of the last k stages in the gate driver.

6.1 Compensation Circuit

Figure 21:
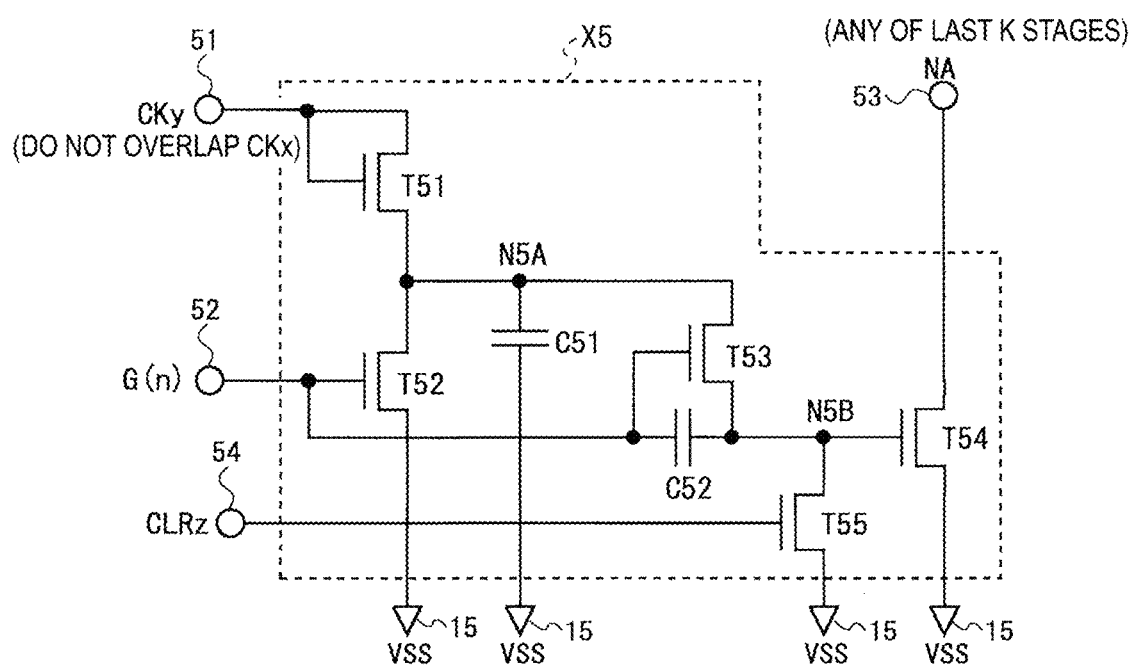
FIG. 21 is a circuit diagram illustrating a configuration of a compensation circuit included in the unit circuit of the gate driver in the sixth embodiment.

FIG. 21 is a circuit diagram illustrating a configuration of the compensation circuit X5. As illustrated in FIG. 21, the compensation circuit X5 has a configuration similar to that of the compensation circuit X4 (FIG. 18) according to the second configuration example provided in the unit circuit 40 according to the fifth embodiment. Note that, the compensation circuit X5 differs from the compensation circuit X4 in FIG. 18 with respect to the signal applied to the input terminal.

As illustrated in FIGS. 20 and 21, the compensation circuit X5 includes an input terminal 51 connected to the clock terminal CLK (input terminal 13), an input terminal 52 connected to the set terminal S (input terminal 11), an output terminal 53 connected to the first internal node NA, an input terminal 54 to which the above-mentioned clear signal CLRz is applied, and the reference power supply terminal VSS (power supply terminal 15), and includes transistors T51, T52, T53, 154, and T55, and capacitors C51 and C52. The transistors T51 to T55 in the compensation circuit X5 correspond to the transistors T41 to T45 in the compensation circuit X4 in FIG. 18, respectively. The capacitors C51 and C52 in the compensation circuit X5 correspond to the capacitors C41 and C42 in the compensation circuit X4 in FIG. 18, respectively. As illustrated in FIG. 21, the connection form of the constituent elements T51 to T55, C51, and C52 in the compensation circuit X5 is the same as the connection form of the constituent elements T41 to 145, C41, and C42 in the compensation circuit X4 in FIG. 18. The compensation circuit X5 includes fourth and fifth internal nodes N5A and N5B corresponding to the second and third internal nodes N4A and N4B in the compensation circuit X4 in FIG. 18, respectively. In the compensation circuit X5, each transistor T5$p$ has the same function as the transistor T4$p$ corresponding to each transistor T5$p$ (p=1 to 5), and each capacitor C5$q$ of this compensation circuit X5 has the same function as the capacitor C4$q$ corresponding to each capacitor C5$q$ (q=1 and 2).

In the compensation circuit X5, the clock signal CKy whose H level period does not overlap (pulse does not overlap) the clock signal CKx applied to the unit circuit 40($n$) including the compensation circuit X5 is applied to the input terminals 51, the output signal G(n) of the unit circuit 40($n$) is applied to the input terminal 52, and the above-mentioned clear signal CLRz corresponding to the unit circuit 40($n$) is applied to the input terminal 54.

In the compensation circuit X5 configured as described above, when the clock signal CKy applied to the input terminal 51 is changed to the H level before the output signal G(n) of the unit circuit 40($n$) including the compensation circuit X5 turns to the H level, the fourth internal node N5A serving as the compensation internal node and the capacitor C51 are charged to the H level via the transistor T51. Note that at this time, the transistor T53 is in the off state, and the fifth internal node N5B is in the floating state.

Thereafter, when the signal G(n) applied to the input terminal 52 changes from the L level to the H level, the voltage of the fourth internal node N5A is discharged via the transistor T52 to turn to the L level (voltage VSS). At this time, the voltage of the fifth internal node N5B temporarily increases due to the function of the capacitor C52, but immediately turns to the L level (voltage VSS) by the transistors T52 and T53 turning to the on state. As a result, while the signal G(n) is at the H level, the voltage VDD-VSS corresponding to the difference between the H level and the L level is held in the capacitor C52. Note that when the fifth internal node N5B is at the L level, the transistor 154 is in the off state.

Thereafter, when the signal G(n) applied to the input terminal 52 changes from the H level to the L level the transistor T52 turns to the off state, and the voltage of the internal node N5B temporarily turns to a voltage lower than the L level voltage VSS by the holding voltage of the capacitor C52, but a current flows from the fourth internal node N5A to the fifth internal node N5B via the transistor T53 in the on state, and the voltage of the fifth internal node N5B increases. As a result, the holding voltage of the capacitor C52, which is the gate-source voltage of the transistor T53, decreases, and when the transistor T53 turns to the off state, the decrease of the holding voltage of the capacitor C52 stops. At this point, a voltage, which is approximately equal to the threshold voltage Vth(T53) of the transistor T53, is held in the capacitor C52, and then the voltage of the fifth internal node N5B is maintained at a value corresponding to this voltage.

The clear signal CLRz applied to the input terminal 54 is a signal which turns to the H level only for a predetermined period after the output signal G(n) of the unit circuit 42$u$($n$) including the compensation circuit X5 changes to the L level (see (A) to (C) in FIG. 8). Thus, the clear signal CLRz changes from the L level to the H level after the signal G(n) applied to the input terminal 52 changes from the H level to the L level. Similarly to the internal node N4B in the compensation circuit X4 in FIG. 18 (see (D) and (E) in FIG. 19), the fifth internal node N5B turns to the L level voltage VSS at the time when the clear signal CLRz changes to the H level and is also at the L level after the clear signal CLRz changes from the H level to the L level voltage VSS.

Thereafter, during a period other than a period when the output signal G(n) of the own stage applied to the input terminal 51 is to be set to the H level voltage VDD, while a condition is satisfied in which the voltage of the signal G(n) is not higher than the voltage of the fourth internal node N5A by the threshold voltage Vth(T53) of the transistor T53 or more, the transistor T53 is maintained in the off state and the fifth internal node N5B is in the floating state. In the configuration illustrated in FIG. 21, since the input terminal 51 for receiving the clock signal CKy is connected to the fourth internal node N5A via the transistor T51 in the diode connection form, the fourth internal node N5A is charged to the H level each time the clock signal CKy changes to the H level. When the fourth internal node N5A turns to the H level in this manner, even when the voltage of the signal G(n) is somewhat fluctuated due to noise or the like during the period when the signal G(n) is to be set to the L level, the above-described condition is satisfied, and thus the transistor T53 is maintained in the off state and the fifth internal node N5B is in the floating state. Thus, due to the function of the capacitor C52, the voltage of the fifth internal node N5B turns to the same value as the voltage of the output signal G(n) of the own stage, and follows the voltage change of the signal G(n). The transistor T51 in the diode connection form described above constitutes a compensation auxiliary circuit for ensuring an operation of such a compensation circuit X5.

6.2 Effect of Sixth Embodiment

According to the present embodiment as described above, by the above-described operation of the compensation circuit X5 included in each of the unit circuits 40 of the last k stages in the gate driver, the transistor 154 functions as the compensation transistor for suppressing the voltage fluctuation at the first internal node NA, and the transistor T53 and the capacitor C52 control the compensation operation by the compensation transistor 154. In other words, during the period when the output signal G(n) of the own stage applied to the input terminal 52 is to be set to the H level (voltage VDD), the transistor 154 is maintained in the off state by setting the fifth internal node N5B to the L level (voltage VSS), and the compensation circuit X5 does not affect the voltage of the first internal node NA. On the other hand, during the period when the signal G(n) applied to the input terminal 52 is to be set to the L level (voltage VSS), when the signal G(n) changes, the voltage of the fifth internal node N5B has the same value as the voltage of the signal G(n) and follows the voltage change of the signal G(n). Thus, even in the case where the stabilization circuit 18 does not normally function and the voltage of the signal G(n) is fluctuated to increase the voltage of the first internal node NA when the signal G(n) applied to the input terminal 51 is to be set to the L level, the voltage of the fifth internal node N5B of the compensation circuit X5 changes in accordance with the voltage fluctuation of the signal G(n) and the leakage current is generated in the transistor 154, and thus the increase of the voltage of the first internal node NA is suppressed and the voltage is brought closer to the L level voltage VSS.

In this way, the compensation circuit X5 (FIG. 21) functions similarly to the compensation circuit provided in the unit circuit 40 in the third embodiment, that is, the compensation circuit including the compensation transistor T5 including the source terminal to which the second compensation stop signal V2 is applied (see FIG. 14). Thus, according to the present embodiment, the similar effect to that of the fourth embodiment can be obtained without using the second compensation stop signal V2.

Note that, according to the present embodiment, the compensation circuit X5 (FIG. 21) is used in place of the compensation circuit including the second compensation transistor T5 including the source terminal to which the second compensation stop signal V2 is applied, and thus the area of each of the unit circuits 40 included in the last k stages is increased as compared with the unit circuit 40 (FIG. 14) in the fourth embodiment. However, since each unit circuit 40 in the present embodiment does not use the output signal of the unit circuit far from the own stage, there is less restriction on the circuit arrangement, and the malfunction due to the voltage fluctuation of the internal node can be prevented while suppressing the increase in the frame region in the GDM panel, as compared with the related art.

7. Modification Example

The disclosure is not limited to the above-described embodiment described above, and various modifications may be made without departing from the scope of the disclosure.

For example, in each of the above-described embodiments, the gate driver includes the first and second gate drivers 410 and 420, and is configured such that the first gate driver 410 drives odd-numbered gate lines GL1, GL3, GL5, . . . , and the second gate driver 420 drives the even-numbered gate lines GL2, GL4, GL6, . . . (see FIGS. 1 and 3), but the present embodiments are not limited to such a configuration. The gate driver in each of the above-described embodiments may be configured to drive all the gate lines GL1 to GLN in the display portion 500 by one gate driver in place of the gate driver having such a configuration. In this case, one gate start pulse signal is input as the first input signal to the first stage of the shift register constituting the gate driver. The gate driver in each of the above-described embodiments may be configured to include a first gate driver that drives all of the gate lines GL1 to GLN from one end side and a second gate driver that drives all of the gate lines GL1 to GLN from the other end side. In this case, one gate start pulse signal is input as the first input signal to the first stage of the shift register constituting the first gate driver and to the first stage of the shift register constituting the second gate driver.

In each of the above-described embodiments, each unit circuit 40 in the gate driver includes the stabilization circuit 18, but may be configured not to include the stabilization circuit 18. Even in the configuration in which each unit circuit 40 does not include the stabilization circuit 18, the malfunction of the gate driver caused by the voltage fluctuation at the internal node NA of the unit circuit 40 can be prevented by the functions of the compensation transistors T3 and T4 or the compensation circuits X4 and X5 described above.

In each of the above-described embodiments, the set circuit is configured using the transistor T2 in the diode connection form in each unit circuit 40 in the gate driver (FIGS. 6, 9, 11, 16, and 20), but the set circuit is not limited to this configuration, and may be configured to supply the H level voltage to the internal node NA only when the signal applied to the input terminal 11 serving as the set terminal is at the H level. For example, the transistor T2 may not be the diode connection form, but may be configured such that only the gate terminal of the transistor T2 is connected to the input terminal 11 and the H level voltage VDD is applied to the drain terminal of the transistor T2. The same applies to the transistor T41 in the diode connection form connected to the input terminal 41 in the compensation circuit X4 (FIGS. 17 and 18), and the transistor T51 in the diode connection form connected to the input terminal 51 in the compensation circuit X5 (FIG. 21).

Although the liquid crystal display device has been described as an example in the embodiments, the disclosure is not limited thereto, and the disclosure is applicable to other types of the display devices such as an organic Electroluminescence (EL) display device as long as the display devices are the active-matrix display device. In a case where the display device 100 according to the embodiments is the active-matrix organic EL display device, the pixel forming sections Ps(i, j) illustrated in FIG. 4 include an organic EL element (also referred to as an organic light emitting diode (OLED)), a holding capacitor, a TFT serving as the drive transistor, a TFT serving as the writing control switching element, and the like, in place of the TFT 10 serving as the pixel switching element, the liquid crystal capacitance Clc, and the like. In this case, the voltage of the data line DLj, that is, the voltage of the data signal Dj, is written and held in the holding capacitor via the writing control switching element that is turned on/off by the gate line GLi, and the drive transistor supplies the current corresponding to the voltage held by the holding capacitor to the organic EL element. As a result, the organic EL element emits light with brightness corresponding to the voltage written in the holding capacitor.

Note that the features of the display device described above may be optionally combined, without contradicting its properties and without departing from the nature of the disclosure, and a display device including some features of the above-described embodiments and modification examples may be configured.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A scanning signal line drive circuit configured to drive a plurality of scanning signal lines arranged on a display portion of a display device, the scanning signal line drive circuit comprising:

a plurality of unit circuits cascade-connected to each other and configured to operate as a shift register based on a multiphase clock signal, wherein the multiphase clock signal includes a plurality of clock signals cyclically corresponding to the plurality of unit circuits, each of the plurality of unit circuits is a bistable circuit corresponding to one of the plurality of scanning signal lines, receives a corresponding clock signal among the plurality of clock signals as an input clock signal, receives an output signal of a predetermined unit circuit of preceding stages or a first input signal applied from the outside of the shift register as a set signal, receives an output signal of a predetermined unit circuit of a succeeding stage or a second input signal applied from the outside of the shift register as a reset signal, and includes a first internal node configured to selectively hold voltages of a first and second logic levels, a set circuit configured to apply the voltage of the first logic level to the first internal node in response to the set signal, a reset circuit configured to apply the voltage of the second logic level to the first internal node in response to the reset signal, and an output circuit configured to generate an output signal of a logic level corresponding to the input clock signal and apply the output signal to a corresponding scanning signal line when the voltage held in the first internal node is at the first logic level, the predetermined unit circuit of the succeeding stage configured to output a signal input as the reset signal is a unit circuit of k stages after an own stage, k being a natural number satisfying i−j≤k≤i−1 when the predetermined unit circuit of the preceding stages configured to output the signal input as the set signal is a unit circuit of j stages before the own stage and the number of phases of the multiphase clock signal is i, the reset circuit includes a reset transistor including a first conduction terminal connected to the first internal node, a second conduction terminal configured to receive the voltage of the second logic level, and a control terminal configured to receive the reset signal, the reset signal input to each of the plurality of unit circuits is an output signal of the unit circuit of k stages after the own stage when the own stage is not one of unit circuits of last k stages in the plurality of unit circuits and is the second input signal when the own stage is any of the unit circuits of the last k stages, the second input signal input to each of the unit circuits of the last k stages is a signal configured to turn to an active state only for a predetermined period after an output signal of the own stage changes from the active state to a non-active state, each of the unit circuits of the last k stages includes a compensation circuit including a compensation transistor including a first conduction terminal connected to the first internal node, the compensation transistor turning on or off according to a compensation control signal being one of the set signal of the own stage or the output signal of the own stage, and the compensation circuit in each of the unit circuits of the last k stages is configured to turn the compensation transistor to an off state or apply the voltage of the first logic level to the first internal node during a period when the first internal node is to hold the voltage of the first logic level, and turn the compensation transistor to an on state or the off state according to the voltage of the compensation control signal and apply the voltage of the second logic level to the first internal node via the compensation transistor when the compensation transistor is in the on state during a period when the first internal node is to hold the voltage of the second logic level.

2. The scanning signal line drive circuit according to claim 1, wherein the compensation transistor in each of the unit circuits of the last k stages further includes a second conduction terminal configured to receive a first compensation stop signal and a control terminal configured to receive the set signal of the own stage, and the first compensation stop signal is the voltage of the first logic level during a period when any of the output signals of the preceding stages applied to any of the unit circuits of the last k stages as the set signal is in the active state, and is the voltage of the second logic level during a period other than the period.

3. The scanning signal line drive circuit according to claim 2, wherein the natural number k configured to specify the last k stages is i−j.

4. The scanning signal line drive circuit according to claim 3, wherein each unit circuit other than last i stages among the plurality of unit circuits further includes a compensation transistor including a first conduction terminal connected to the first internal node, a second conduction terminal configured to receive the voltage of the second logic level, and a control terminal configured to receive an output signal of a unit circuit of i stages after the own stage, and each unit circuit other than the last i stages among the plurality of unit circuits is configured such that the compensation transistor is in the on state when the voltage of the output signal of the unit circuit of the i stages after is at the first logic level, and the compensation transistor is in the off state when the voltage of the output signal of the unit circuit of the i stages after is at the second logic level.

5. The scanning signal line drive circuit according to claim 4, wherein each unit circuit of the last i stages further includes a compensation transistor including a first conduction terminal connected to the first internal node, a second conduction terminal configured to receive a second compensation stop signal, and a control terminal configured to receive the output signal of the own stage, each unit circuit of the last i stages is configured such that the compensation transistor is in the on state when the voltage of the output signal of the own stage is at the first logic level, and the compensation transistor is in the off state when the voltage of the output signal of the own stage is at the second logic level, and the second compensation stop signal is the voltage of the first logic level during a period when any of output signals of the last i stages is in the active state, and is the voltage of the second logic level during a period other than the period.

6. The scanning signal line drive circuit according to claim 1,
wherein the compensation transistor in each of the unit circuits of the last k stages further includes a second conduction terminal configured to receive a second compensation stop signal and a control terminal configured to receive an output signal of the own stage, and
the second compensation stop signal is the voltage of the first logic level during a period when any of the output signals of the last k stages is in the active state, and is the voltage of the second logic level during a period other than the period.

7. The scanning signal line drive circuit according to claim 1,
wherein the compensation transistor in each of the unit circuits of the last k stages further includes a second conduction terminal configure to receive the voltage of the second logic level and a control terminal,
the compensation circuit in each of the unit circuits of the last k stages further includes
a compensation internal node configured to selectively hold the voltages of the first and second logic levels,
a compensation setting transistor including a first conduction terminal connected to the compensation internal node, a second conduction terminal configured to receive the voltage of the second logic level, and a control terminal configured to receive the set signal of the own stage,
a compensation control transistor including a first conduction terminal connected to the compensation internal node, a second conduction terminal connected to the control terminal of the compensation transistor, and a control terminal configured to receive the set signal of the own stage, and
a compensation control capacitor including a first terminal and a second terminal connected to the control terminal and the second conduction terminal of the compensation control transistor, respectively, and
the compensation circuit is configured such that when the voltage of the set signal of the own stage is at the first logic level, the compensation setting transistor turns to the on state and applies the voltage of the second logic level to the compensation internal node, and the compensation control transistor turns to the on state and applies the voltage of the compensation internal node to the control terminal of the compensation transistor, and when the voltage of the set signal of the own stage is at the second logic level, the compensation setting transistor and the compensation control transistor turn to the off state.

8. The scanning signal line drive circuit according to claim 7,
wherein the compensation circuit in each of the unit circuits of the last k stages further includes a transistor including a first conduction terminal connected to the control terminal of the compensation transistor, a second conduction terminal configured to receive the voltage of the second logic level, and a control terminal configured to receive the second input signal applied to the own stage.

9. The scanning signal line drive circuit according to claim 7,
wherein the compensation circuit in each of the unit circuits of the last k stages further includes a compensation auxiliary circuit configured to apply the voltage of the first logic level to the compensation internal node when the voltage of the corresponding clock signal is at the first logic level.

10. The scanning signal line drive circuit according to claim 1,
wherein the compensation transistor in each of the unit circuits of the last k stages further includes a second conduction terminal configured to receive the voltage of the second logic level and a control terminal,
the compensation circuit in each of the unit circuits of the last k stages further includes
a compensation internal node configured to selectively hold the voltages of the first and second logic levels,
a compensation setting transistor including a first conduction terminal connected to the compensation internal node, a second conduction terminal configured to receive the voltage of the second logic level, and a control terminal configured to receive an output signal of the own stage,
a compensation control transistor including a first conduction terminal connected to the compensation internal node, a second conduction terminal connected to the control terminal of the compensation transistor, and a control terminal configured to receive an output signal of the own stage, and
a compensation control capacitor including a first terminal and a second terminal connected to the control terminal and the second conduction terminal of the compensation control transistor, respectively, and
the compensation circuit is configured such that when the voltage of the output signal of the own stage is at the first logic level, the compensation setting transistor turns to the on state and applies the voltage of the second logic level to the compensation internal node, and the compensation control transistor turns to the on state and applies the voltage of the compensation internal node to the control terminal of the compensation transistor, and when the voltage of the output signal of the own stage is at the second logic level, the compensation setting transistor and the compensation control transistor turn to the off state.

11. The scanning signal line drive circuit according to claim 10,
wherein the compensation circuit in each of the unit circuits of the last k stages further includes a transistor including a first conduction terminal connected to a control terminal of the compensation transistor, a second conduction terminal configured to receive the voltage of the second logic level, and a control terminal configured to receive the second input signal applied to the own stage.

12. The scanning signal line drive circuit according to claim 10,
wherein the compensation circuit in each of the unit circuits of the last k stages further includes a compensation auxiliary circuit configured to receive any of the plurality of clock signals in which a pulse does not overlap the corresponding clock signal among the plurality of clock signals, and applies the voltage of the first logic level to the compensation internal node when the voltage of the received clock signal is at the first logic level.

13. The scanning signal line drive circuit according to claim 1,
wherein the output circuit includes
an output transistor including a first conduction terminal configured to receive the input clock signal, a second conduction terminal connected to a corresponding scanning signal line, and a control terminal connected to the first internal node, and
a capacitor including a first terminal and a second terminal connected to the control terminal and the second conduction terminal of the output transistor, respectively.

14. A display device comprising:
a display portion provided with a plurality of data signal lines, a plurality of scanning signal lines intersecting the plurality of data signal lines, and a plurality of pixel forming sections arranged in a matrix shape along the plurality of data signal lines and the plurality of scanning signal lines, wherein
the display device includes
a data signal line drive circuit configured to drive the plurality of data signal lines and
the scanning signal line drive circuit according to claim 1.

15. The display device according to claim 14,
wherein the scanning signal line drive circuit includes
a first scanning signal line drive unit disposed on one end side of the plurality of scanning signal lines and including unit circuits each corresponding to a respective one of odd-numbered scanning signal lines among the plurality of scanning signal lines as the plurality of unit circuits, and
a second scanning signal line drive unit disposed on the other end side of the plurality of scanning signal lines and including unit circuits each corresponding to a respective one of even-numbered scanning signal lines among the plurality of scanning signal lines as the plurality of unit circuits.

16. The display device according to claim 14,
wherein the scanning signal line drive circuit and the display portion are integrally formed on an identical substrate.

* * * * *